United States Patent
Langhammer et al.

(10) Patent No.: US 8,041,759 B1
(45) Date of Patent: *Oct. 18, 2011

(54) SPECIALIZED PROCESSING BLOCK FOR PROGRAMMABLE LOGIC DEVICE

(75) Inventors: Martin Langhammer, Alderbury (GB); Kwan Yee Martin Lee, Hayward, CA (US); Orang Azgomi, Sunnyvale, CA (US); Keone Streicher, San Ramon, CA (US); Robert L. Pelt, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1035 days.

This patent is subject to a terminal disclaimer.

(21) Appl. No.: 11/447,370

(22) Filed: Jun. 5, 2006

Related U.S. Application Data

(60) Provisional application No. 60/772,465, filed on Feb. 9, 2006.

(51) Int. Cl.
*H03K 19/173* (2006.01)
*H01L 25/00* (2006.01)
*G06F 17/10* (2006.01)
*G06F 17/17* (2006.01)
*G06F 7/38* (2006.01)

(52) U.S. Cl. ........ 708/523; 708/501; 708/301; 708/313; 326/47; 326/38

(58) Field of Classification Search .......... 708/290–409; 326/37–39
See application file for complete search history.

(56) References Cited

U.S. PATENT DOCUMENTS

| | | | |
|---|---|---|---|
| 3,473,160 A | 10/1969 | Wahlstrom | |
| 4,156,927 A | 5/1979 | McElroy et al. | |
| 4,179,746 A | 12/1979 | Tubbs | |
| 4,212,076 A | 7/1980 | Conners | |
| 4,215,406 A | 7/1980 | Gomola et al. | |
| 4,215,407 A | 7/1980 | Gomola et al. | |
| 4,422,155 A | 12/1983 | Amir et al. | |
| 4,484,259 A | 11/1984 | Palmer et al. | |

(Continued)

FOREIGN PATENT DOCUMENTS
EP 0 158 430 10/1985
(Continued)

OTHER PUBLICATIONS
Xilinx Inc., "XTREME DSP for Virtex-4 FPGAs User Guide," v1.2, Feb. 4, 2005.*

(Continued)

*Primary Examiner* — Lewis Bullock, Jr.
*Assistant Examiner* — Matthew Sandifer
(74) *Attorney, Agent, or Firm* — Ropes & Gray LLP; Jeffrey H. Ingerman

(57) ABSTRACT

A specialized processing block for a programmable logic device incorporates a fundamental processing unit that performs a sum of two multiplications, adding the partial products of both multiplications without computing the individual multiplications. Such fundamental processing units consume less area than conventional separate multipliers and adders. The specialized processing block further has input and output stages, as well as a loopback function, to allow the block to be configured for various digital signal processing operations, including finite impulse response (FIR) filters and infinite impulse response (IIR) filters. By using the programmable connections, and in some cases the programmable resources of the programmable logic device, and by running portions of the specialized processing block at higher clock speeds than the remainder of the programmable logic device, more complex FIR and IIR filters can be implemented.

27 Claims, 22 Drawing Sheets

U.S. PATENT DOCUMENTS

| | | | |
|---|---|---|---|
| 4,521,907 A | 6/1985 | Amir et al. | |
| 4,575,812 A | 3/1986 | Kloker et al. | |
| 4,597,053 A | 6/1986 | Chamberlin | |
| 4,616,330 A | 10/1986 | Betz | |
| 4,623,961 A | 11/1986 | Mackiewicz | |
| 4,682,302 A | 7/1987 | Williams | |
| 4,718,057 A | 1/1988 | Venkitakrishnan et al. | |
| 4,727,508 A | 2/1988 | Williams | |
| 4,736,335 A | 4/1988 | Barkan | |
| 4,791,590 A | 12/1988 | Ku et al. | |
| 4,799,004 A | 1/1989 | Mori | |
| 4,823,295 A | 4/1989 | Mader | |
| 4,839,847 A | 6/1989 | Laprade | |
| 4,871,930 A | 10/1989 | Wong et al. | |
| 4,912,345 A | 3/1990 | Steele et al. | |
| 4,918,637 A | 4/1990 | Morton | |
| 4,967,160 A | 10/1990 | Quievy et al. | |
| 4,982,354 A | 1/1991 | Takeuchi et al. | |
| 4,991,010 A | 2/1991 | Hailey et al. | |
| 4,994,997 A | 2/1991 | Martin et al. | |
| 5,073,863 A | 12/1991 | Zhang | |
| 5,081,604 A * | 1/1992 | Tanaka | 708/319 |
| 5,122,685 A | 6/1992 | Chan et al. | |
| 5,128,559 A | 7/1992 | Steele | |
| 5,175,702 A | 12/1992 | Beraud et al. | |
| 5,208,491 A | 5/1993 | Ebeling et al. | |
| RE34,363 E | 8/1993 | Freeman | |
| 5,267,187 A | 11/1993 | Hsieh et al. | |
| 5,296,759 A | 3/1994 | Sutherland et al. | |
| 5,338,983 A | 8/1994 | Agarwala | |
| 5,339,263 A | 8/1994 | White | |
| 5,349,250 A | 9/1994 | New | |
| 5,357,152 A | 10/1994 | Jennings, III et al. | |
| 5,371,422 A | 12/1994 | Patel et al. | |
| 5,375,079 A | 12/1994 | Uramoto et al. | |
| 5,381,357 A | 1/1995 | Wedgwood et al. | |
| 5,404,324 A | 4/1995 | Colon-Bonet | |
| 5,424,589 A | 6/1995 | Dobbelaere et al. | |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | |
| 5,497,498 A | 3/1996 | Taylor | |
| 5,500,812 A | 3/1996 | Saishi et al. | |
| 5,500,828 A | 3/1996 | Doddington et al. | |
| 5,523,963 A | 6/1996 | Hsieh et al. | |
| 5,528,550 A | 6/1996 | Pawate et al. | |
| 5,537,601 A | 7/1996 | Kimura et al. | |
| 5,541,864 A | 7/1996 | Van Bavel et al. | |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,563,819 A | 10/1996 | Nelson | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,631,848 A | 5/1997 | Laczko et al. | |
| 5,633,601 A | 5/1997 | Nagaraj | |
| 5,636,150 A | 6/1997 | Okamoto | |
| 5,636,368 A | 6/1997 | Harrison et al. | |
| 5,640,578 A | 6/1997 | Balmer et al. | |
| 5,644,519 A | 7/1997 | Yatim | |
| 5,644,522 A | 7/1997 | Moyse et al. | |
| 5,646,545 A | 7/1997 | Trimberger et al. | |
| 5,646,875 A | 7/1997 | Taborn et al. | |
| 5,648,732 A | 7/1997 | Duncan | |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,808,926 A | 9/1998 | Gorshtein et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,847,978 A | 12/1998 | Ogura et al. |
| 5,847,981 A | 12/1998 | Kelley et al. |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A | 3/2000 | Yu et al. |
| 6,041,340 A | 3/2000 | Mintzer |
| 6,052,327 A | 4/2000 | Reddy et al. |
| 6,052,755 A | 4/2000 | Terrill et al. |
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |

| | | | |
|---|---|---|---|
| 6,073,154 A | 6/2000 | Dick | |
| 6,075,381 A | 6/2000 | LaBerge | |
| 6,084,429 A | 7/2000 | Trimberger | |
| 6,085,317 A | 7/2000 | Smith | |
| 6,091,261 A | 7/2000 | DeLange | |
| 6,091,765 A | 7/2000 | Pietzold, III et al. | |
| 6,094,726 A | 7/2000 | Gonion et al. | |
| 6,097,988 A | 8/2000 | Tobias | |
| 6,098,163 A | 8/2000 | Guttag et al. | |
| 6,107,820 A | 8/2000 | Jefferson et al. | |
| 6,107,821 A | 8/2000 | Kelem et al. | |
| 6,107,824 A | 8/2000 | Reddy et al. | |
| 6,130,554 A | 10/2000 | Kolze et al. | |
| 6,140,839 A | 10/2000 | Kaviani et al. | |
| 6,144,980 A | 11/2000 | Oberman | |
| 6,154,049 A | 11/2000 | New | |
| 6,157,210 A | 12/2000 | Zaveri et al. | |
| 6,163,788 A | 12/2000 | Chen et al. | |
| 6,167,415 A | 12/2000 | Fischer et al. | |
| 6,175,849 B1 | 1/2001 | Smith | |
| 6,215,326 B1 | 4/2001 | Jefferson et al. | |
| 6,226,735 B1 | 5/2001 | Mirsky | |
| 6,242,947 B1 | 6/2001 | Trimberger | |
| 6,243,729 B1 | 6/2001 | Staszewski | |
| 6,246,258 B1 | 6/2001 | Lesea | |
| 6,279,021 B1 | 8/2001 | Takano et al. | |
| 6,286,024 B1 | 9/2001 | Yano et al. | |
| 6,314,442 B1 | 11/2001 | Suzuki | |
| 6,314,551 B1 | 11/2001 | Borland | |
| 6,321,246 B1 | 11/2001 | Page et al. | |
| 6,323,680 B1 | 11/2001 | Pedersen et al. | |
| 6,327,605 B2 | 12/2001 | Arakawa et al. | |
| 6,351,142 B1 | 2/2002 | Abbott | |
| 6,353,843 B1 | 3/2002 | Chehrazi et al. | |
| 6,359,468 B1 | 3/2002 | Park et al. | |
| 6,360,240 B1 | 3/2002 | Takano et al. | |
| 6,362,650 B1 | 3/2002 | New et al. | |
| 6,366,944 B1 | 4/2002 | Hossain et al. | |
| 6,367,003 B1 | 4/2002 | Davis | |
| 6,369,610 B1 | 4/2002 | Cheung et al. | |
| 6,377,970 B1 | 4/2002 | Abdallah et al. | |
| 6,407,576 B1 | 6/2002 | Ngai et al. | |
| 6,407,694 B1 | 6/2002 | Cox et al. | |
| 6,427,157 B1 | 7/2002 | Webb | |
| 6,434,587 B1 | 8/2002 | Liao et al. | |
| 6,438,569 B1 | 8/2002 | Abbott | |
| 6,438,570 B1 | 8/2002 | Miller | |
| 6,446,107 B1 | 9/2002 | Knowles | |
| 6,453,382 B1 | 9/2002 | Heile | |
| 6,467,017 B1 | 10/2002 | Ngai et al. | |
| 6,480,980 B2 | 11/2002 | Koe | |
| 6,483,343 B1 | 11/2002 | Faith et al. | |
| 6,487,575 B1 | 11/2002 | Oberman | |
| 6,523,055 B1 | 2/2003 | Yu et al. | |
| 6,523,057 B1 | 2/2003 | Savo et al. | |
| 6,531,888 B2 | 3/2003 | Abbott | |
| 6,538,470 B1 | 3/2003 | Langhammer et al. | |
| 6,542,000 B1 | 4/2003 | Black et al. | |
| 6,556,044 B2 | 4/2003 | Langhammer et al. | |
| 6,557,092 B1 | 4/2003 | Callen | |
| 6,571,268 B1 | 5/2003 | Giacalone et al. | |
| 6,573,749 B2 | 6/2003 | New et al. | |
| 6,574,762 B1 | 6/2003 | Karimi et al. | |
| 6,591,283 B1 | 7/2003 | Conway et al. | |
| 6,591,357 B2 | 7/2003 | Mirsky | |
| 6,600,495 B1 | 7/2003 | Boland et al. | |
| 6,600,788 B1 | 7/2003 | Dick et al. | |
| 6,628,140 B2 | 9/2003 | Langhammer et al. | |
| 6,687,722 B1 | 2/2004 | Larsson et al. | |
| 6,692,534 B1 | 2/2004 | Wang et al. | |
| 6,700,581 B2 | 3/2004 | Baldwin et al. | |
| 6,725,441 B1 | 4/2004 | Keller et al. | |
| 6,728,901 B1 | 4/2004 | Rajski et al. | |
| 6,731,133 B1 | 5/2004 | Feng et al. | |
| 6,732,134 B1 | 5/2004 | Rosenberg et al. | |
| 6,744,278 B1 | 6/2004 | Liu et al. | |
| 6,745,254 B2 | 6/2004 | Boggs et al. | |
| 6,763,367 B2 | 7/2004 | Kwon et al. | |
| 6,771,094 B1 | 8/2004 | Langhammer et al. | |
| 6,774,669 B1 | 8/2004 | Liu et al. | |
| 6,781,408 B1 | 8/2004 | Langhammer | |
| 6,781,410 B2 | 8/2004 | Pani et al. | |
| 6,788,104 B2 | 9/2004 | Singh et al. | |
| 6,801,924 B1 | 10/2004 | Green et al. | |
| 6,801,925 B2 | 10/2004 | Green et al. | |
| 6,836,839 B2 | 12/2004 | Master et al. | |
| 6,874,079 B2 | 3/2005 | Hogenauer | |
| 6,889,238 B2 | 5/2005 | Johnson | |
| 6,904,471 B2 | 6/2005 | Boggs et al. | |
| 6,924,663 B2 | 8/2005 | Masui et al. | |
| 6,971,083 B1 | 11/2005 | Farrugia et al. | |
| 6,978,287 B1 | 12/2005 | Langhammer | |
| 6,983,300 B2 | 1/2006 | Ferroussat | |
| 7,020,673 B2 | 3/2006 | Ozawa | |
| 7,047,272 B2 | 5/2006 | Giacalone et al. | |
| 7,062,526 B1 | 6/2006 | Hoyle | |
| 7,093,204 B2 * | 8/2006 | Oktem et al. | 716/1 |
| 7,107,305 B2 * | 9/2006 | Deng et al. | 708/523 |
| 7,113,969 B1 | 9/2006 | Green et al. | |
| 7,181,484 B2 | 2/2007 | Stribaek et al. | |
| 7,313,585 B2 | 12/2007 | Winterrowd | |
| 7,395,298 B2 | 7/2008 | Debes et al. | |
| 7,409,417 B2 | 8/2008 | Lou | |
| 7,415,542 B2 | 8/2008 | Hennedy et al. | |
| 7,421,465 B1 | 9/2008 | Rarick et al. | |
| 7,428,566 B2 | 9/2008 | Siu et al. | |
| 7,430,578 B2 * | 9/2008 | Debes et al. | 708/603 |
| 7,430,656 B2 | 9/2008 | Sperber et al. | |
| 7,472,155 B2 * | 12/2008 | Simkins et al. | 708/523 |
| 7,536,430 B2 * | 5/2009 | Guevokian et al. | 708/631 |
| 7,567,997 B2 * | 7/2009 | Simkins et al. | 708/523 |
| 7,590,676 B1 | 9/2009 | Langhammer | |
| 7,646,430 B2 | 1/2010 | Brown Elliott et al. | |
| 7,668,896 B2 * | 2/2010 | Lutz et al. | 708/503 |
| 7,719,446 B2 | 5/2010 | Rosenthal et al. | |
| 7,822,799 B1 | 10/2010 | Langhammer et al. | |
| 2001/0023425 A1 | 9/2001 | Oberman et al. | |
| 2001/0029515 A1 | 10/2001 | Mirsky | |
| 2002/0002573 A1 | 1/2002 | Landers et al. | |
| 2002/0038324 A1 | 3/2002 | Page et al. | |
| 2002/0049798 A1 | 4/2002 | Wang et al. | |
| 2002/0078114 A1 | 6/2002 | Wang et al. | |
| 2002/0089348 A1 | 7/2002 | Langhammer | |
| 2002/0116434 A1 | 8/2002 | Nancekievill | |
| 2003/0088757 A1 | 5/2003 | Lindner et al. | |
| 2004/0064770 A1 | 4/2004 | Xin | |
| 2004/0083412 A1 | 4/2004 | Corbin et al. | |
| 2004/0103133 A1 | 5/2004 | Gurney | |
| 2004/0148321 A1 | 7/2004 | Guevorkian et al. | |
| 2004/0172439 A1 | 9/2004 | Lin | |
| 2004/0178818 A1 | 9/2004 | Crotty et al. | |
| 2004/0193981 A1 | 9/2004 | Clark et al. | |
| 2004/0267857 A1 | 12/2004 | Abel et al. | |
| 2004/0267863 A1 | 12/2004 | Bhushan et al. | |
| 2005/0038842 A1 | 2/2005 | Stoye | |
| 2005/0144212 A1 | 6/2005 | Simkins et al. | |
| 2005/0144215 A1 | 6/2005 | Simkins et al. | |
| 2005/0144216 A1 | 6/2005 | Simkins et al. | |
| 2005/0166038 A1 | 7/2005 | Wang et al. | |
| 2005/0187997 A1 | 8/2005 | Zheng et al. | |
| 2005/0187999 A1 | 8/2005 | Zheng et al. | |
| 2006/0020655 A1 | 1/2006 | Lin | |
| 2007/0185951 A1 | 8/2007 | Lee et al. | |
| 2007/0185952 A1 * | 8/2007 | Langhammer et al. | 708/493 |
| 2007/0241773 A1 | 10/2007 | Hutchings et al. | |
| 2008/0133627 A1 | 6/2008 | Langhammer et al. | |
| 2009/0187615 A1 | 7/2009 | Abe et al. | |

FOREIGN PATENT DOCUMENTS

| | | |
|---|---|---|
| EP | 0 380 456 | 8/1990 |
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |

| | | |
|---|---|---|
| EP | 0 905 906 | 3/1999 |
| EP | 0 909 028 | 4/1999 |
| EP | 0 927 393 | 7/1999 |
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 7-135447 | 5/1995 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |

OTHER PUBLICATIONS

Altera Corporation, "Stratix Device Handbook, vol. 2, Section IV—Digital Signal Processing (DSP)," v1.1, Sep. 2004.*

Amos, D., "PLD architectures match DSP algorithms," *Electronic Product Design*, vol. 17, No. 7, Jul. 1996, pp. 30, 32.

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs" *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 456-461.

Aoki, T., "Signed-weight arithmetic and its application to a field-programmable digital filter architecture," *IEICE Transactions on Electronics*, 1999, vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al. "Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings-Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.

Gaffar, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http://www.ee.washington.edu/people/faculty/hauck/publications/ReconfigFuture.PDF.

Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGA Express™ Interface Manual: ispLEVER® Version 3.0*, 2002.

Lucent Technologies, Microelectronics Group,"Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Confernece on ASIC Proceedings (IEEE Cat. No. 96TH8140)*, Oct. 21-24, 1996, pp. 275-279.

Jones, G., "Field-programmable digital signal conditioning," *Electronic Product Design*, vol. 21, No. 6, Jun. 2000, pp. C36-C38.

Kiefer, R., et al., "Performance comparison of software/FPGA hardware partitions for a DSP application," *14th Australian Microelectronics Conference. Microelectronics: Technology Today for the Future. MICRO '97 Proceedings*, Sep. 28-Oct. 1, 1997, pp. 88-93.

Kramberger, I., "DSP acceleration using a reconfigurable FPGA," *ISIE '99. Proceedings of the IEEE International Symposium on Industrial Electronics (Cat No. 99TH8465)*, vol. 3, Jul. 12-16, 1999, pp. 1522-1525.

Langhammer, M., "How to implement DSP in programmable logic," *Elettronica Oggi*, No. 226, Dec. 1998, pp. 113-115.

Langhammer, M., "Implementing a DSP in Programmable Logic," *Online EE Times*, May 1998, http://www.eetimes.com/editorial/1998/coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," First International Conference on 3G Mobile Communication Technologies (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems (Digest)*, No. 233, 1998, pp. 2/1-2/4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9), vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A, et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL '99, Proceedings (Lecture Notes in Computer Science* vol. 1673), Lysaght, P., et al., eds., Aug. 30-Sep. 1, 1999, pp. 264-273.

Tralka, C., "Embedded digital signal processor (DSP) modules in programmable logic devices (PLDs)," *Elektronik*, vol. 49, No. 14, Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http://www.iro.umontreal.ca/~aboulham/F6221/Xilinx%20A%201D%20systolic%20FIR.htm.

Xilinx, Inc., "The Future of FPGA's," White Paper, available Nov. 14, 2005 for download from http://www.xilinx.com/prs_rls,5yrwhite.htm.

Weisstein, E.W., "Karatsuba Multiplication," *MathWorld—A Wolfram Web Resource* (Dec. 9, 2007), accessed Dec. 11, 2007 at http://mathworld.wolfram.com/KaratsubaMultiplication.html.

Altera Corporation, "DSP Blocks in Stratix II and Stratix II GX Devices" *Stratix II Device Handbook*, vol. 2, Chapter 6, v4.0 (Oct. 2005).

Underwood, K. "FPGAs vs. CPUs: Trends in Peak Floating-Point Performance," *Proceedings of the 2004 ACM/SIGDA 12th International Symposium on Field Programmable Gate Arrays*, pp. 171-180, Feb. 22-24, 2004.

Xilinx Inc., "XtremeDSP Design Considerations User Guide," v 1.2, Feb. 4, 2005.

Altera Corporation, "Statix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

Haynes, S.D., et al., "Configurable multiplier blocks for embedding in FPGAs," *Electronics Letters*, vol. 34, No. 7, pp. 638-639 (Apr. 2, 1998).

Altera Corporation, "FIR Compiler: MegaCore® Function User Guide," version 3.3.0, rev. 1, pp. 3 11 through 3 15 (Oct. 2005).

\* cited by examiner

SPECIALIZED PROCESSING BLOCK FOR PROGRAMMABLE LOGIC DEVICE

CROSS REFERENCE TO RELATED APPLICATION

This claims the benefit of copending, commonly-assigned U.S. Provisional Patent Application No. 60/772,465, filed Feb. 9, 2006, which is hereby incorporated by reference herein in its entirety.

BACKGROUND OF THE INVENTION

This invention relates to programmable logic devices (PLDs), and, more particularly, to specialized processing blocks which may be included in such devices.

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, a PLD sold by Altera Corporation, of San Jose, Calif., under the name STRATIX® II includes DSP blocks, each of which includes four 18-by-18 multipliers. Each of those DSP blocks also includes adders and registers, as well as programmable connectors (e.g., multiplexers) that allow the various components to be configured in different ways. In each such block, the multipliers can be configured not only as four individual 18-by-18 multipliers, but also as four smaller multipliers, or as one larger (36-by-36) multiplier. In addition, one 18-by-18 complex multiplication (which decomposes into two 18-by-18 multiplication operations for each of the real and imaginary parts) can be performed. In order to support four 18-by-18 multiplication operations, the block has 4×(18+18)=144 inputs. Similarly, the output of an 18-by-18 multiplication is 36 bits wide, so to support the output of four such multiplication operations, the block also has 36×4=144 outputs.

However, those inputs and outputs may not be used in every mode in which the DSP block can operate. For example, if the DSP block is configured as a finite impulse response (FIR) filter, with 18-bit data and coefficients, each block may be used to perform the summation of four 18-by-18 multiplications to form a 4-tap sub-block of a longer FIR filter. In this case, the number of inputs is 4×(18+18)=144 lines, but the output is only 38 bits wide even though the DSP block is able to support 144 output lines. Similarly, in a 36-by-36 bit multiplication, all four internal multipliers are used but only (36+36)=72 input lines and 72 output lines are used (even thought there are 144 input lines and 144 output lines). Hence, in that configuration the input lines are not used fully even though the core of the DSP block is fully used.

Input/output (I/O) drivers and lines can consume significant device area. Indeed, in a DSP block of the aforementioned STRATIX® II PLD, I/O resources consume approximately 50% of the DSP block area. And yet, as discussed above, they are not always used. At the same time, they cannot be eliminated because all of the potential configurations of the block have to be supported.

It would be desirable to be able to reduce the area of a PLD consumed by a specialized processing block such as a DSP block without losing functionality of the block.

SUMMARY OF THE INVENTION

The present invention relates to specialized processing blocks for PLDs wherein the specialized processing blocks have reduced area without losing functionality. According to one aspect of the invention, the specialized processing block preferably includes a plurality of fundamental processing units instead of discrete multipliers. Each fundamental processing unit preferably includes the equivalent of at least two multipliers and logic to sum the partial products of all of the at least two multipliers. As a result, the sums of the all of the multiplications are computed in a single step, rather than summing the partial products of each multiplier to form individual products and then summing those products. Such a fundamental processing unit can be constructed with an area smaller than that of the individual multipliers and adders. If a single multiplication is required to be performed, one of the multipliers in fundamental processing unit is used while the inputs to the other(s) are zeroed out. Nevertheless, because the provision of the fundamental processing unit reduces the area of the specialized processing block, efficiency is improved.

In a preferred embodiment, the fundamental processing unit includes the equivalent of two 18-by-18 multipliers and one adder so that it can output the sum of the two multiplication operations. While each of the 18-by-18 multipliers can be configured for a smaller multiplication operation (e.g., 9-by-9 or 12-by-12), the integrated nature of the fundamental processing unit means that the individual multiplier outputs are not accessible. Only the sum is available for use by the remainder of the specialized processing block. Therefore, to obtain the result of a single non-complex multiplication that is 18 bits-by-18 bits or smaller, an entire fundamental processing unit must be used. The second multiplier, which cannot be disengaged, simply has its inputs zeroed.

The specialized processing block according to the invention preferably also has one or more additional adders for additional processing of the output, of the fundamental processing unit, as well as optional pipeline registers and a flexible output stage. Therefore the specialized processing block preferably can be configured for various forms of filtering and other digital signal processing operations. In addition, the specialized processing block preferably also has the capability to feed back at least one of its outputs as an input, which is useful in adaptive filtering operations, and to chain both inputs and outputs to additional specialized processing blocks.

Therefore, in accordance with the present invention, there is provided a specialized processing block for a programmable logic device. The specialized processing block is adaptable to form a finite impulse response (FIR) filter and includes a plurality of fundamental processing units. Each of the fundamental processing units includes a plurality of multipliers, and circuitry for adding, in one operation, partial products produced by all of the plurality of multipliers. There are a first plurality of input registers for inputting coefficients of the FIR filter as inputs to the plurality of multipliers, and a second plurality of input registers for inputting data to the FIR filter. The registers are chained for inputting data seriatim to each of the plurality of multipliers. An output stage includes a plurality of adders, the plurality of adders being adaptable to provide as an output a sum of (1) a multiplication operation involving two of the fundamental processing units and (2) a corresponding output cascaded from another of the plurality of adders in a first other output stage in a first other one of the specialized processing blocks. An output cascade register registers the output for cascading to a second other output stage in a second other one of the specialized processing blocks. The second plurality of input registers includes a delay register to compensate for the output cascade register when the second plurality of input registers are chained to a corresponding second plurality of input registers in the second other one of the specialized processing blocks.

The programmable logic device may also include an output cascade register for registering the output for cascading to a second other output stage in a second other one of the specialized processing blocks. Such a programmable logic device may further include a first plurality of input registers for inputting data to the FIR filter, those registers being chained for inputting data seriatim to each of the plurality of multipliers, and a delay register chained with the first plurality of input registers to compensate for the output cascade register when the first plurality of input registers are chained to a corresponding first plurality of input registers in that second other one of the specialized processing blocks.

In an embodiment adaptable to form an interpolation filter, the programmable logic device has a device clock speed, and the multipliers, the circuitry for adding and the output stage operate at a second clock speed faster than the device clock speed. During one cycle of the device clock speed, the multipliers and the circuitry for adding process one set of data against multiple sets of coefficients on second inputs to produce multiple sets of results that are output during that one cycle of the device clock speed.

In an embodiment adaptable to form a decimation filter, the programmable logic device has a device clock speed, the multipliers and the circuitry for adding operate at a second clock speed at least four times the device clock speed, and the output stage operates at a third clock speed at least twice the device clock speed. During one cycle of the second clock speed, the multipliers and the circuitry for adding process one set of data to produce results that are accumulated such that during one cycle of the third clock speed the multipliers and the circuitry for adding process a plurality of sets of data. In this embodiment, the programmable logic device further includes a multiplexer upstream of the first plurality of input registers and a demultiplexer downstream of the output stage. During one cycle of the device clock speed the multipliers, the circuitry for adding and the output stage process a plurality of the plurality of sets of data, all of the sets of data being accumulated across cycles of the third clock speed.

In an embodiment adaptable to form a finite impulse response (FIR) lattice filter, the programmable logic device includes a plurality of specialized processing blocks, each of the specialized processing blocks including a plurality of fundamental processing units, each of the fundamental processing units including a plurality of multipliers, and circuitry for adding, in one operation, partial products produced by all of said plurality of multipliers. Each of the specialized processing blocks computes one stage of the FIR lattice filter, where each stage is represented by terms $f_k(n)$ and $g_k(n)$, k represents a stage, n represents a sample, and each of $f_k(n)$ and $g_k(n)$ is expressed in terms of $f_{k-1}(n)$ and $g_{k-1}(n-1)$. For any kth stage, $f_k(n)$ is computed by one of the fundamental processing units forming a sum of (a) a product of (1) $f_{k-1}(n)$ and (2) 1, and (b) a product of (1) $g_{k-1}(n-1)$ and (2) a coefficient $\Gamma_k$. For any kth stage, $g_k(n)$ is computed by one of the fundamental processing units forming a sum of (a) a product of (1) $f_{k-1}(n)$ and (2) a coefficient $\Gamma_k$, and (b) a product of (1) $g_{k-1}(n-1)$ and (2) 1, and $g_k(n)$ is delayed by registration to provide $g_k(n-1)$. As a result, $f_k(n)$ and $g_k(n-1)$ from the kth stage are available as $f_{k-1}(n)$ and $g_{k-1}(n-1)$ for a (k+1)th stage.

In an embodiment of a programmable logic device adaptable to form an infinite impulse response (IIR) lattice filter, the programmable logic device includes a plurality of specialized processing blocks, each of the specialized processing blocks including a plurality of fundamental processing units. Each of the fundamental processing units includes a plurality of multipliers, and circuitry for adding, in one operation, partial products produced by all of said plurality of multipliers. Loopback circuitry feeds back an output of the specialized processing block to an input of the specialized processing block. Each of the specialized processing blocks computes one stage of the IIR lattice filter, where each stage is represented by terms $f_k(n)$ and $g_k(n)$, k represents a stage, n represents a sample, and each of $f_k(n)$ and $g_k(n)$ is expressed in terms of $f_{k-1}(n)$ and $g_{k-1}(n-1)$. For any (k–1)th stage, $f_{k-1}(n)$ is computed by a first one of the fundamental processing units forming a sum of (a) a product of (1) $f_k(n)$, which is derived from a kth stage, and (2) 1, and (b) a product of (1) $g_{k-1}(n-1)$ and (2) a coefficient $-\Gamma_k$. For any kth stage, $g_k(n)$ is computed by a second one of the fundamental processing units forming a sum of (a) a product of (1) $f_{k-1}(n)$, which is looped back from the first fundamental processing unit via the loopback circuitry, and (2) a coefficient $\Gamma_k$, and (b) a product of (1) $g_{k-1}(n-1)$ and (2) 1, and $g_k(n)$ is delayed by registration to provide $g_k(n-1)$. As a result, $f_k(n)$ and $g_k(n-1)$ from the kth stage are available as $f_{k-1}(n)$ and $g_{k-1}(n-1)$ for a (k+1)th stage.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-27.

Figure 1:
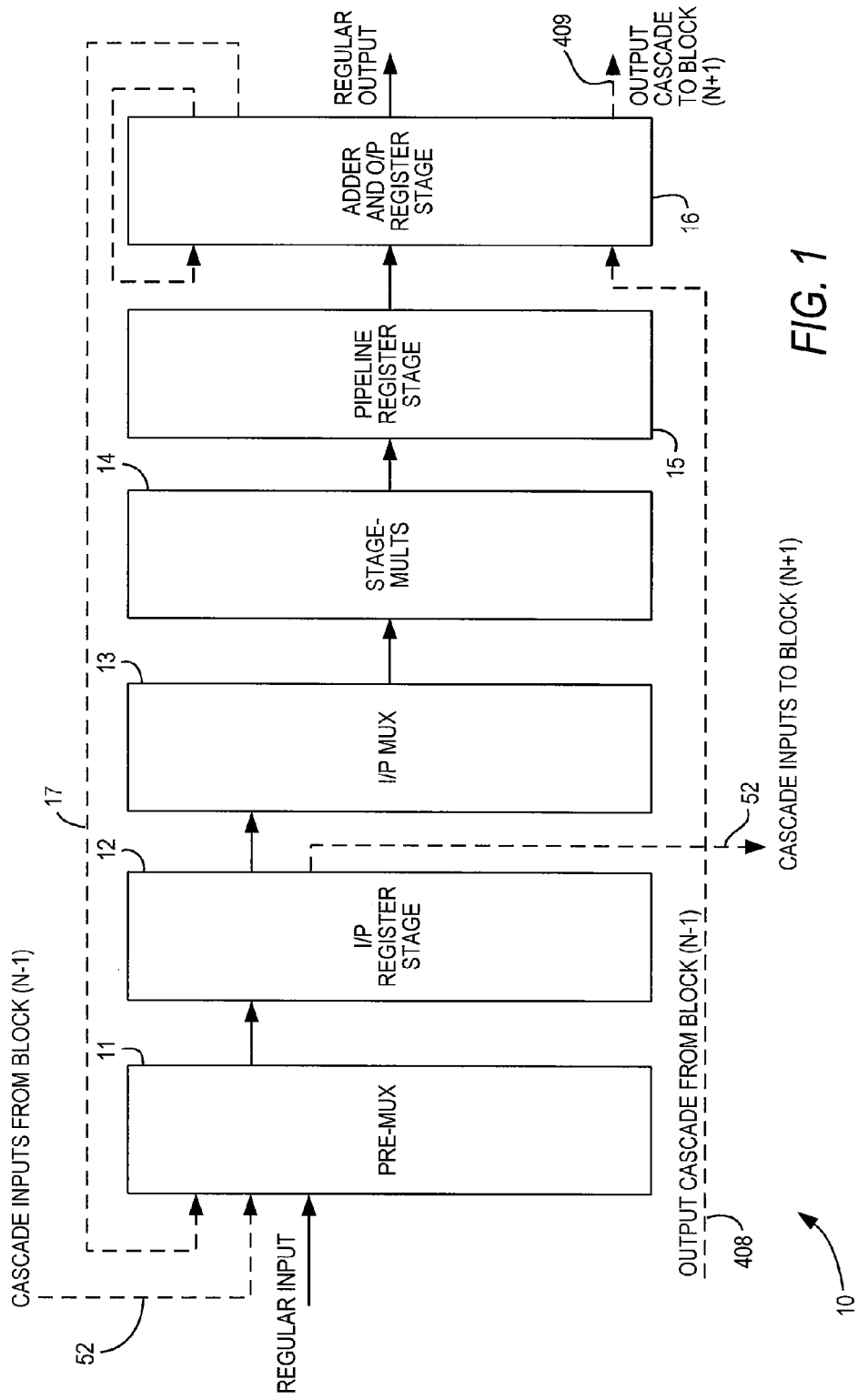
FIG. 1 is a high-level diagram of one preferred embodiment of a specialized processing block in accordance with the present invention.
Figure 2:
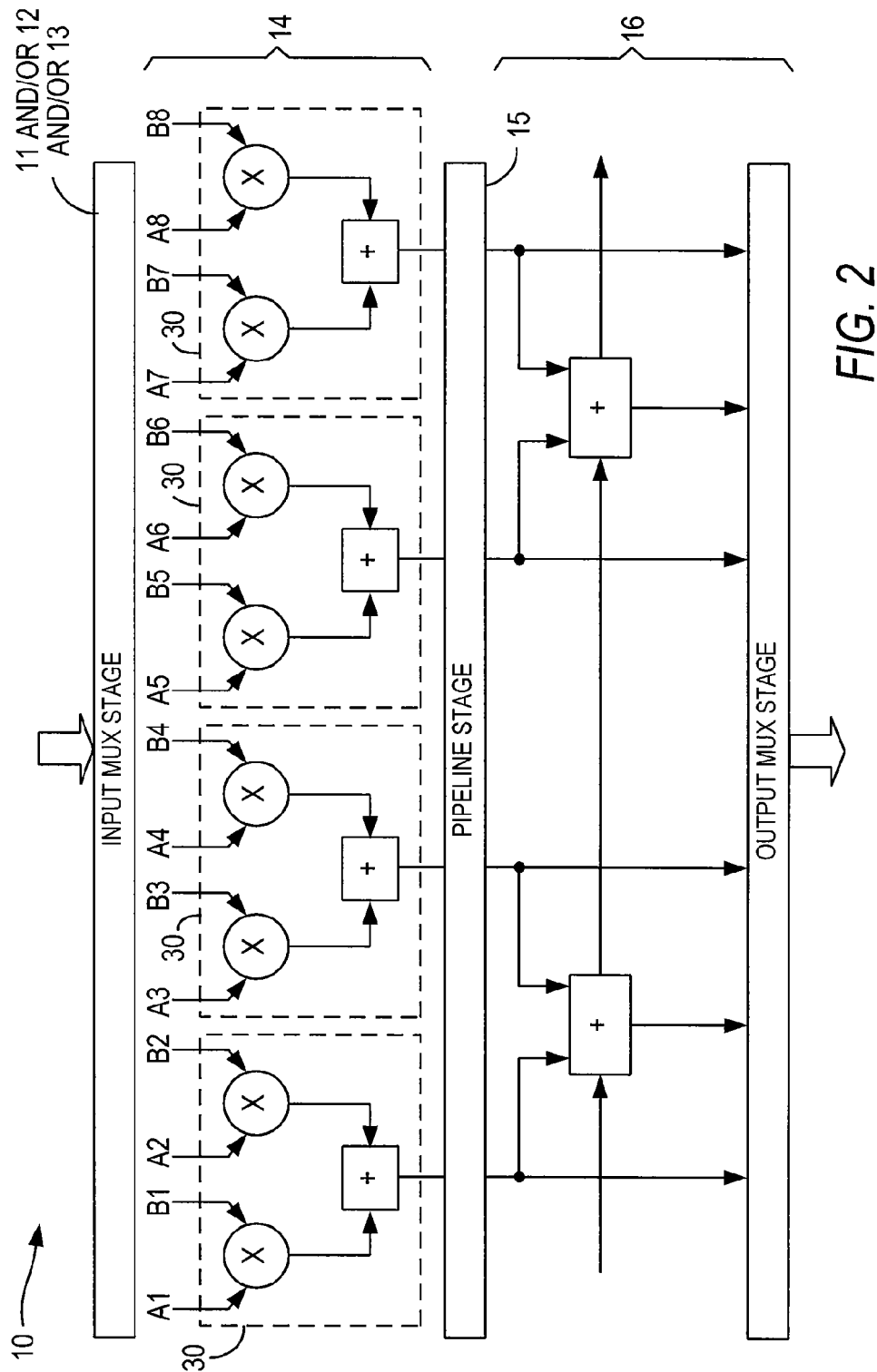
FIG. 2 is a functional diagram of the specialized processing block of FIG. 1.

FIG. 1 shows a high-level diagram of one preferred embodiment 10 of a specialized processing block according to the invention, while FIG. 2 is a functional diagram of the same embodiment 10.

As seen in FIG. 1, specialized processing block 10 includes optional input pre-MUX stage 11, optional input register stage 12, optional input multiplexing stage 13, multiplication stage 14, optional pipeline register stage 15 and adder/output stage 16.

The function of input pre-MUX stage 11, if provided, is to format the regular inputs, loopback inputs and cascade inputs (see below) into a form suitable for registering.

Regular inputs do not require any specific formatting. Cascade inputs may be a one-register delayed version of a previous input, and therefore may need formatting accordingly. However, such formatting also can be done in programmable logic of the programmable logic device of which specialized processing block 10 is a part, so if formatting of cascade inputs is the only pre-MUX function required, input pre-MUX stage 11 can be omitted or, if provided, bypassed. The loopback input 17 may be arranged so that it is always connected to a particular multiplier or group of multipliers. The formatting performed by input pre-MUX stage 11 may include the direction of particular inputs to particular bit locations depending on the function to be performed by specialized processing block 10. The formatting may be carried out in one embodiment according to a stored table identifying the various possible operations (e.g., simple or complex multiplications of various sizes, shifting operations, rotation operations, etc.) and specifying the corresponding formatting required.

The output of input pre-MUX stage 11, if provided, may be registered by optional input register stage 12. If there in no input pre-MUX stage 11, then the input register function, if needed, can be performed in the programmable logic portion of the programmable logic device of which block 10 is a part. Therefore, input register stage 12 is considered optional. Input register stage 12, even if provided, preferably can be optionally bypassed in cases where unregistered outputs are needed or desired.

Input multiplexing stage 13, if provided, takes registered or unregistered inputs from input pre-MUX stage 11 and inputs potentially from elsewhere in the programmable logic device and formats the data for the different operational modes. In that respect it is similar to input pre-MUX stage 11, and therefore frequently if one of input pre-MUX stage 11 and input multiplexing stage 13 is provided, the other will not be provided.

As one example of the type of formatting performed by input pre-MUX stage 11 or input multiplexing stage 13, consider an 18-by-18 complex multiplication in which:

$$\text{Real Result} = Re[(a+jb) \times (c+jd)] = (ac-bd)$$

$$\text{Imag Result} = Im[(a+jb) \times (c+jd)] = (ad+bc)$$

This complex operation requires four 18-by-18 multiplications and hence eight 18-bit inputs, but because there are only four unique 18-bit shared inputs, input multiplexing stage 13 will take the inputs a, b, c and d and perform the necessary duplication so those four inputs are properly routed to the correct multiplier inputs for each of the real and imaginary calculations. Similarly, for 9- and 12-bit mode operations, input pre-MUX stage 11 and/or input multiplexing stage 13 ensures correct alignments of the input bits in order to obtain correct results.

Multiplication stage 14 preferably includes a plurality of fundamental processing units as described above. In a preferred embodiment, each specialized processing block 10 (see FIG. 2) includes four fundamental processing units 30, meaning that it can perform up to eight multiplications in groups of two multiplications that are summed together. In that embodiment, the fundamental processing units in specialized processing block 10 preferably are grouped into identical half-blocks, so that each half-block in its own right can be considered a specialized processing block within the invention.

Each fundamental processing unit preferably includes the functionality for a sum of two 18-by-18 multiplications. The fundamental processing units preferably are all identical, but in some embodiments, it is possible to provide a negation function on only some inputs of some multipliers, as maybe required for, e.g., complex multiplication where, as is apparent above, subtraction may be required. Alternatively, the negation function may be provided in the adder portion of the fundamental processing unit, so that one or more adders can also perform subtraction.

Figure 3:
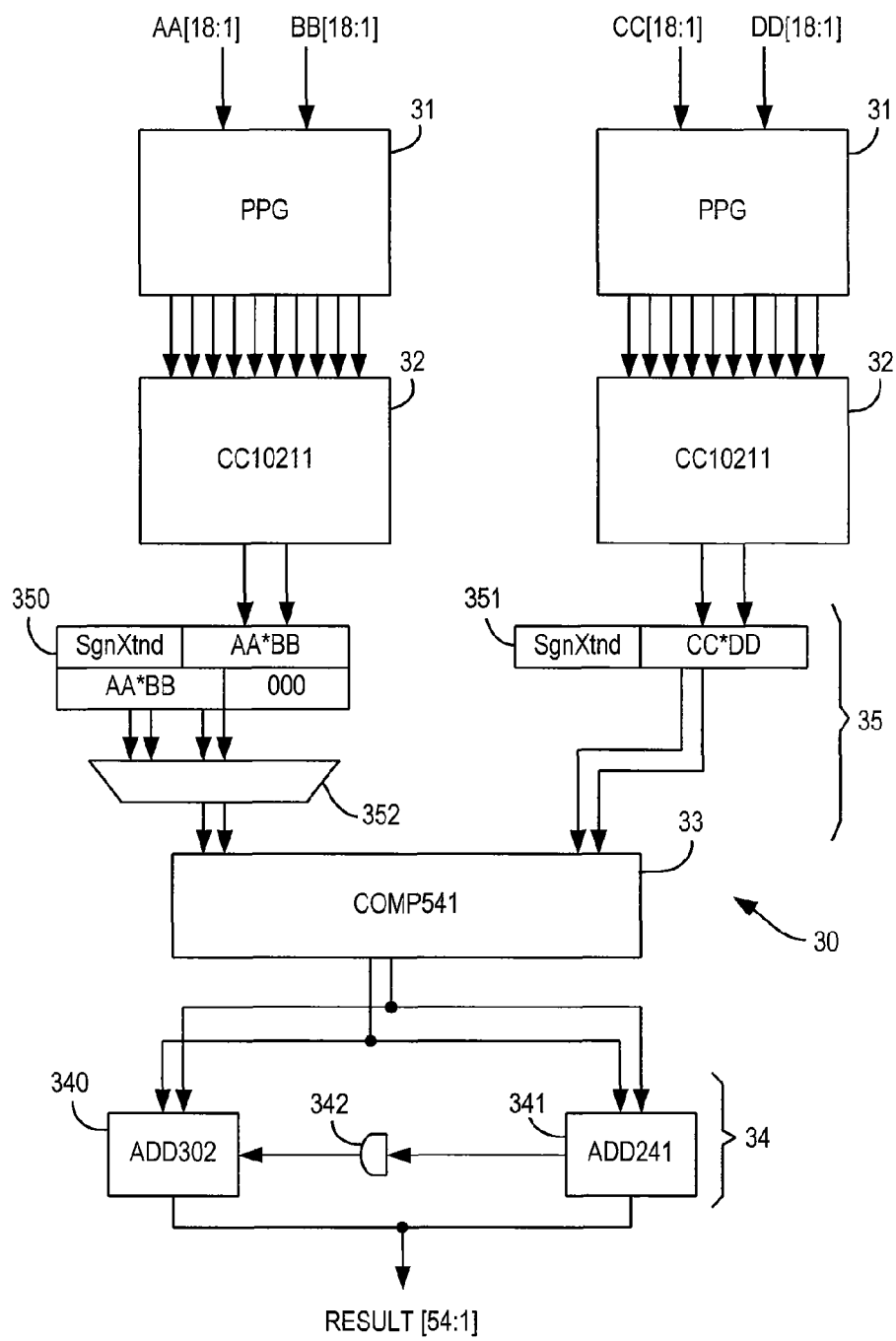
FIG. 3 is a block diagram of a preferred embodiment of a fundamental processing unit for a specialized processing block in accordance with the present invention.

The structure of a preferred embodiment of a fundamental processing unit is shown in FIG. 3. Each fundamental processing unit 30 preferably supports a sum of two 18-by-18 multiplications and preferably includes two partial product generators 31, two ten-vector-to-two-vector compressors 32, a 4-to-2 compressor 33, and two carry-propagate adders 34. Adders 34 preferably include one 30-bit adder 340 and one 24-bit adder 341, which are selectably connectable by a control signal 342. For smaller multiplications such as 9-by-9 or 12-by-12, only 24 bits are required, so the two adders can be disconnected to allow two independent multiplications. For larger multiplications such as 18-by-18, the two adders 34 should be linked as a single adder.

Each partial product generator 31 preferably creates nine 20-bit signed Booth-encoded vectors (Booth-encoding is a known technique that can reduce the number of partial products), as well as a 17-bit unsigned carry vector (negative partial products are in ones-complement format, with the associated carry-in bit in the carry vector). An additional 19-bit signed partial product may be generated in the case of unsigned multipliers (which preferably will always be zero for signed multipliers). Although preferably up to 11 vectors may be generated, the carry bits preferably can be combined with the partial product vectors, requiring only 10 vectors to be compressed.

The partial products preferably are compressed down to two 39-bit vectors (36 bits plus sign extension bits). Any sign extensions should be preserved properly past the 36-bit 18-by-18 multiplier boundary, so that any sign extensions can be valid up to the 72-bit 36-by-36 multiplier boundary (in a case where two fundamental processing units are combined to implement a 36-by-36 multiplication as described below). After compression, the results preferably are processed in mux-and-shift circuitry 35, which preferably include combinatorial logic where any sign-extension, zero-filling or shifting of the results before addition, as may be required depending on the operation being performed, can be accomplished prior to final combination of the results in 4-to-2 compressor 33 and carry-propagate adders 34. For each of circuits 350, 351, the inputs preferably are two 39-bit vectors for a total of 78 input bits, while the outputs preferably are two 54-bit vectors for a total of 108 bits. The extra thirty bits are the result of sign extension, zero-filling, and or shifting. Multiplexer 352 indicates a selection between sign extended or zero-filled results. The four 54-bit vectors are input to compressor 33 which outputs two 54-bit vectors, which are added in adders 34 to produce a 54-bit output.

As discussed above, because the partial products from both multipliers are added at once, the two multipliers of a fundamental processing unit cannot be used for two independent multiplications, but a single multiplication can be carried out by zeroing the inputs of the second multiplier.

For smaller multiplications, independent subset multipliers (9-by-9 and 12-by-12 cases) may be handled as follows:

For two 9-by-9 multiplications, the first 9-by-9 multiplication preferably is calculated using the most significant bits (MSBs) of the first multiplier (on the left in FIG. 3), and the second 9-by-9 multiplication preferably is calculated using the least significant bits (LSBs) of the second multiplier (on the right in FIG. 3). The MSBs of the right multiplier are filled with the sign extensions of the corresponding values, as appropriate. The outputs of the left multiplier (sum and carry vectors) are left-shifted by 18 bits. The two multiplier outputs preferably are then compressed together and the two resulting final vectors are then added with the two adders 34, which are not connected for this operation. The first 9-by-9 result preferably will be output on the MSBs of the left (30-bit) adder 340, while the second 9-by-9 result preferably will be output on the LSBs of the right (24-bit) adder 341.

Independent 12-by-12 multiplications can be calculated in a manner similar to a 9-by-9 multiplication, using the MSB/LSB method.

In both cases, preferably the right multiplier outputs are zeroed above 24 bits to prevent any interference with the independent left multiplier result.

In the case of summed multiplications, regardless of the precision, all inputs preferably are shifted to occupy the MSBs of the multipliers used, and the output vectors preferably are not shifted. The output vectors, however, preferably are fully sign-extended, so that sign-extension out of the adders 34 can be used for the full width of the accumulator (below).

Preferably, for complex multiplications and other operations that require subtraction of products, the adder inputs can be negated (effectively making the adder an adder/subtractor). Alternatively, however, one or more of the multipliers can be provided with the ability to selectively negate its output vectors, by inverting the input (ones' complement), and adding the multiplicand to the result. The multiplicand addition can be performed in the compression of the partial products, so that the negation can be implemented before adders 34.

Pipeline register stage 15, which preferably may be bypassed at the user's option, preferably allows outputs of multiplication stage 14 to be registered prior to further addition or accumulation or other processing.

Figure 4:
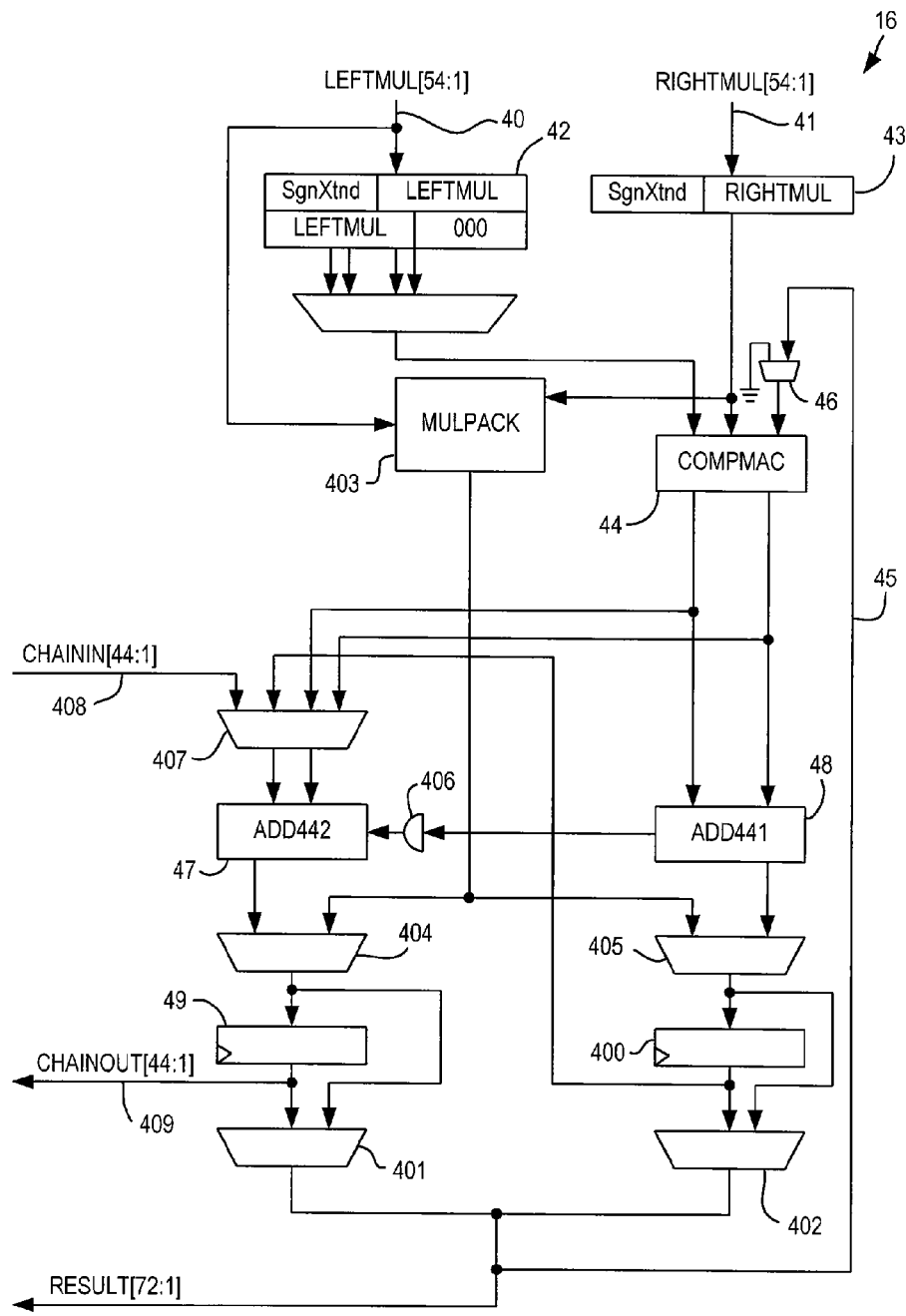
FIG. 4 is a preferred embodiment of an output stage of a specialized processing block in accordance with the present invention

Adder/output stage 16 preferably selectively shifts, adds, accumulates, or registers its inputs, or any combination of the above. Its inputs preferably are the outputs of the two fundamental processing units in specialized processing block 10. As seen in FIG. 4, those two inputs 40, 41 are input to respective register/shifter units 42, 43, which optionally may shift or sign extend inputs 40, 41. In a preferred embodiment, each of inputs 40, 41 is a 54-bit vector, which is shifted or sign-extended to create a respective 72-bit vector.

The outputs of units 42, 43 preferably are input to a 3:2 compressor 44, along, preferably, with the output 45 of stage 16 itself. This feedback provides an accumulation function to specialized processing block 10. Preferably, the fed-back output 45 passes through multiplexer 46, which can alternatively select a zero (e.g., ground) input when accumulation is not necessary or desired.

The outputs of compressor 44 are provided (through appropriate multiplexers as described below) to two adders 47, 48, which may be chained together under programmable control, depending on the use to which they are to be put, as described below. The outputs of adders 47, 48 preferably may be registered in registers 49, 400 or not, as determined by multiplexers 401, 402. Registered or not, outputs 47, 48 preferably make up the output vector of specialized processing block 10. As an alternative path, multiplexers 403, 404, 405 allow adders 47, 48 to be bypassed where the outputs of fundamental processing units 30 are to be output without further processing.

In the case, described above, where each fundamental processing unit 30 can perform a sum of two 18-by-18 multiplications, two fundamental processing units 30 can perform a 36-by-36 multiplication, which, as is well known, can be decomposed into four 18-by-18 multiplications. In such a case, two compressed 72-bit vectors preferably are output by compressor 44 and preferably are added together by the two 44-bit adders 47, 48, which are programmably connected together for this mode by AND gate 406. The upper 16 bits may be ignored in this mode.

In other modes with narrower outputs, where adders 47, 48 need not be connected together, adders 47, 48 optionally may be arranged to chain the output of specialized processing block 10 with the similar output of another specialized processing block 10. To facilitate such a mode, the output of register 400, for example, may be fed back to 4:2 multiplexer 407, which provides two inputs to adder 47. The other inputs to multiplexer 407 may be the two vectors output by compressor 44 and chain-in input 408 from another specialized processing block 10, which may be provided via chain-out output 409 from register 49 of that other specialized processing block 10.

Thus, in chaining mode, 44-bit adder 48 may be used to add together the results within one of specialized processing blocks 10—configured, e.g., as a single multiplier, a sum of multipliers, or an accumulator.—with the results of the previous block. By using multiplexer 407 to select as inputs to adder 47 the output of adder 48 and the output of another specialized processing block 10, the output of the current specialized processing block 10 can be the chained sum of the outputs of the current and previous specialized processing blocks 10. If the chaining mode is used, only a 44-bit accumulator is available, which will still give a 6-bit to 8-bit guard band, depending on the number of multipliers. However, as is apparent, the chaining mode is not available for the 36-bit mode, in which both adders 47, 48 are needed to obtain the result of a single specialized processing block 10.

The output paths may be slightly different depending on the mode of operation. Thus, multiplexers 401, 402 allow selection of registered or unregistered outputs of adders 47, 48. It will be appreciated, however, that, as shown, registered outputs preferably are used in cascade or chained mode.

In addition, at least one output may be looped back, as at 17, to an input of specialized processing block 10. Such a loopback feature may be used, for example, if specialized processing block 10 is programmably configured for adaptive filtering. Although multiple loopbacks may be provided, in a preferred embodiment, one loopback 17 to single multiplier or group of multipliers is provided.

Figure 5:
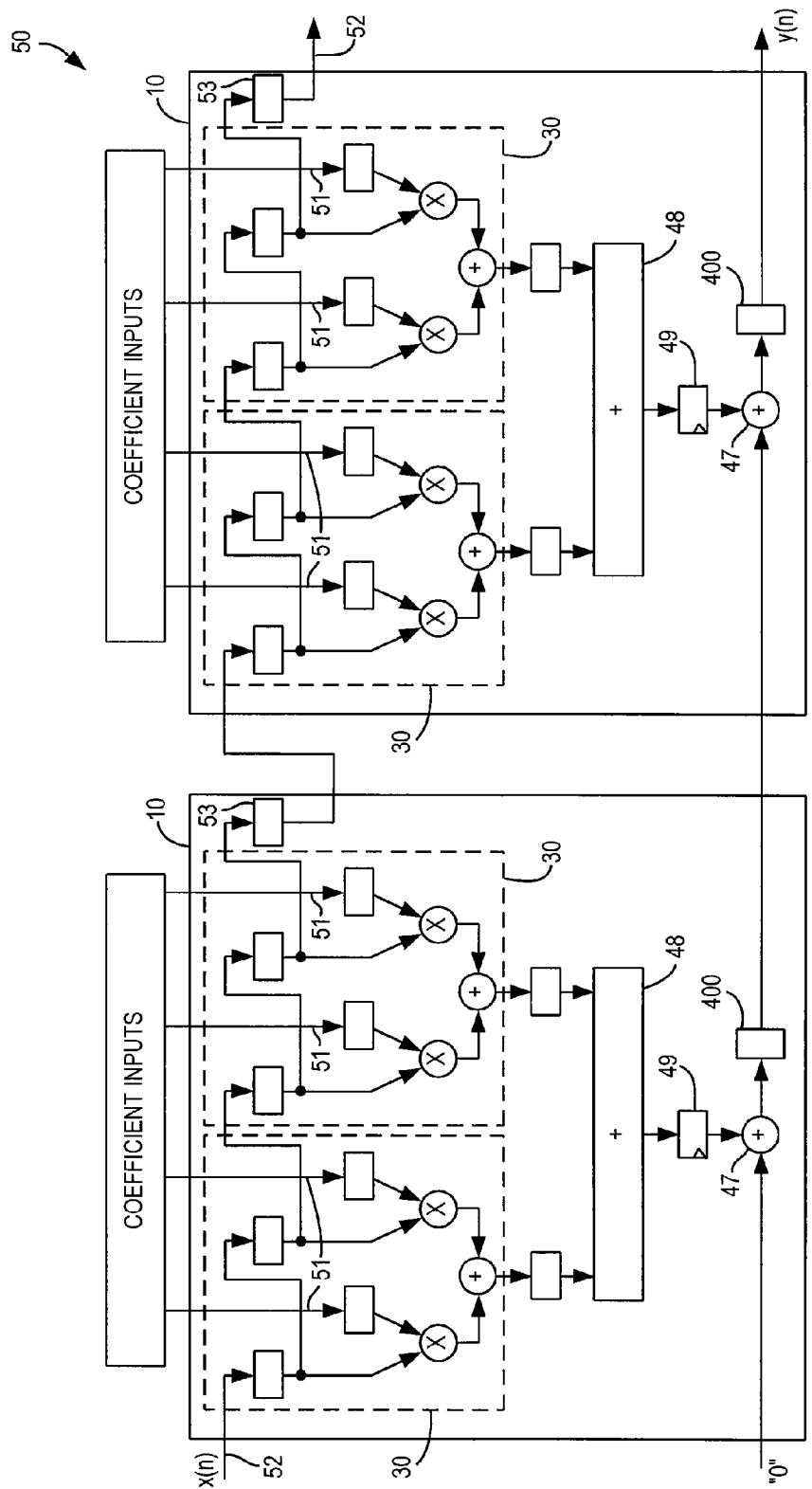
FIG. 5 is a functional diagram of a specialized processing block in accordance with a first preferred embodiment of the present invention configured as part of a finite impulse response filter.

The specialized processing block 10 of the present invention may be programmably configured as a long chain finite impulse response (FIR) filter. As shown in FIG. 5, four fundamental processing units 30 are configured as part of such a FIR filter 50. As discussed above, this may be considered to be either one or two specialized processing blocks 10. As shown, each of adders 48 is used to add the results of four multiplications, with adders 47 used in the chaining or cascade mode described above to add together the outputs of adders 48 (as well, possibly, as the outputs of adders 48 of other specialized processing blocks 10) to form a long FIR filter. The coefficients of the FIR filter are input at 51, while the data to be filtered are input via register chain 52, preferably formed in one of input pre-MUX stage 11, input register stage 12 or input multiplexing stage 13. To account for delay introduced by the output cascade chain, at least one extra delay 53 (e.g., in the form of an extra register) preferably is provided in input cascade chain 52. Preferably, the number of delays corresponds to the number of adders 47 or, more particularly, output registers 409 for which delay 53 compensate. Generally, this would amount to one delay 53 for each pair of fundamental processing units 30. As discussed above, although in a preferred embodiment two fundamental processing units 30 make up a half-block, they also could be considered a specialized processing block 10 in their own right.

For a single channel FIR example with N=8 taps and using two fundamental processing units 30.*to* carry out a "sum-of-four" operation—the sum of the multiplication of four multiplicands (i.e., the sum of two multiplications)—one can write the following:

$$y(n) = \sum_{i=0}^{7} x(n-i)h(i)$$
$$= z^{-1}[x(n)h(0) + x(n-1)h(1) + x(n-2)h(2) + x(n-3)h(3)] +$$
$$z^{0}[x(n-4)h(4) + x(n-5)h(5) + x(n-6)h(6) + x(n-7)h(7)]$$
$$= z^{-1}[x(n)h(0) + x(n-1)h(1) + x(n-2)h(2) + x(n-3)h(3) +$$
$$x(n-5)h(4) + x(n-6)h(5) + x(n-7)h(6) + x(n-8)h(7)]$$

As shown in FIG. 5, and as just discussed, there is an extra delay after each block of two fundamental processing units 30 in order to compensate for the extra delay introduced by the register 490, and this is reflected in the equation by the absence of the x(n−4) term.

Figure 6:
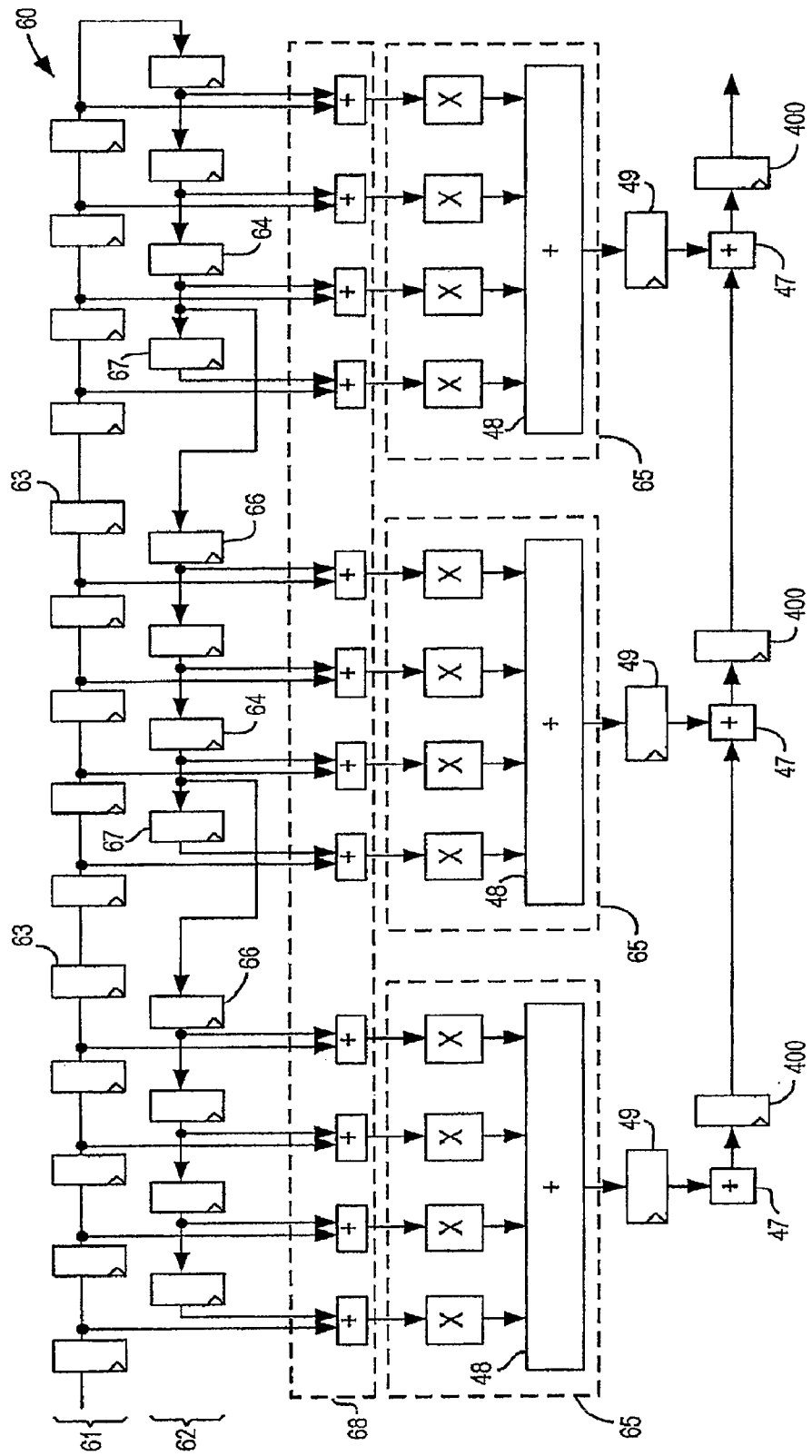
FIG. 6 is a functional diagram of a specialized processing block in accordance with a first preferred embodiment of the present invention configured as part of a single-channel symmetrical finite impulse response filter.

FIG. 6 shows a regular single channel symmetrical FIR filter 60. In a symmetrical FIR filter, the filter coefficients are symmetrical around the mid-point. For a single channel symmetrical FIR filter example with N=16 taps and using two fundamental processing units 30 to perform sum-of-four operations we can write the following:

$$y(n) = \sum_{i=0}^{15} x(n-i)h(i) = \sum_{i=0}^{7}[x(n-i) + x(n+i-15)]h(i)$$
$$= z^{-1}\{h(0)[x(n-0) + x(n-15)] + h(1)[x(n-1) + x(n-14)] +$$
$$h(2)[x(n-2) + x(n-13)] + h(3)[x(n-3) + x(n-12)]\} +$$
$$z^{0}\{h(4)[x(n-4) + x(n-11)] + h(5)[x(n-5) + x(n-10)] +$$
$$h(6)[x(n-6) + x(n-9)] + h(7)[x(n-7) + x(n-8)]\}$$
$$= z^{-1}\{h(0)[x(n-0) + x(n-15)] + h(1)[x(n-1) + x(n-14)] +$$
$$h(2)[x(n-2) + x(n-13)] + h(3)[x(n-3) + x(n-12)] +$$
$$h(4)[x(n-5) + x(n-12)] + h(5)[x(n-6) + x(n-11)] +$$
$$h(6)[x(n-7) + x(n-10)] + h(7)[x(n-8) + x(n-9)]\}$$

As shown in FIG. 6, an extra delay 63 is provided in the forward path 61 as in the regular FIR filter case described above. However, because the register delay is already taken into account in forward path 61, there needs to be a "zero delay" path on the reverse path 62. This "zero delay" is provided by chaining the third coefficient 64 of each sum-of-four operation 65 directly to the first coefficient 66 of the next sum-of-four operation 65 in addition to chaining it to the fourth coefficient 67. Because additional registers are required beyond those present in specialized processing block 10, the input register chain in this embodiment, as well as adders 68, preferably are implemented in the programmable logic portion of the programmable logic device of which specialized processing block 10 is a part.

Figure 7:
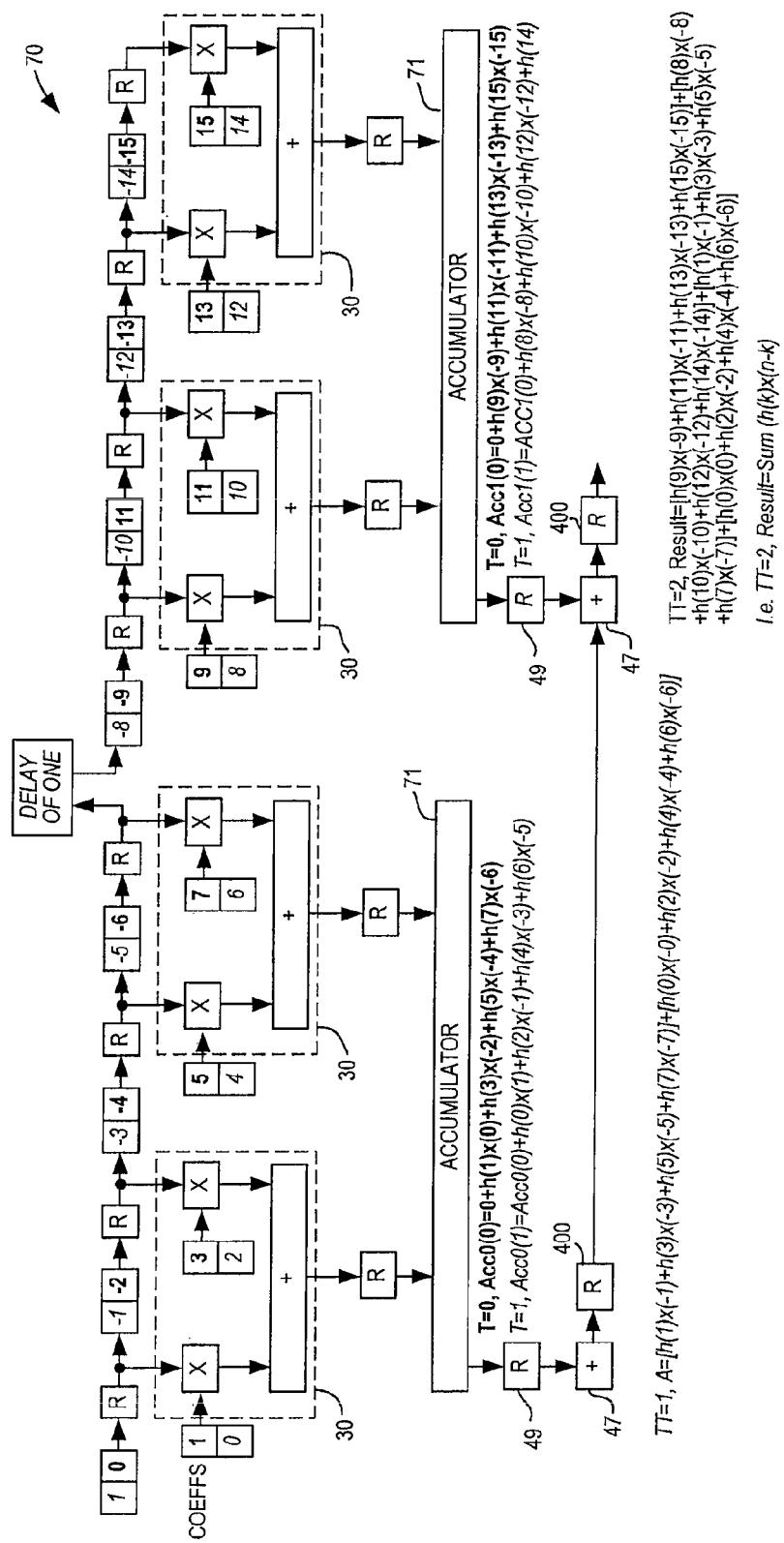
FIG. 7 is a functional diagram of a specialized processing block in accordance with a first preferred embodiment of the present invention configured as part of a single-channel semi-parallel finite impulse response filter.

FIG. 7 shows a single channel semi-parallel FIR filter 70. In a semi-parallel FIR filter, time-sharing on the multipliers preferably is used so that preferably fewer resources are required to implement the FIR filter. Typically, this may be used when the multiplier speeds exceed the speed at which the FIR filter as a whole is required to operate.

In order to time-share the multipliers, the accumulation mode preferably is used. The intermediate results of each stage are collected the accumulator 71 and when the time is correct, the final summation is done via the cascade adders 47. In FIG. 7, a 16-tap filter is implemented by four fundamental processing units 30 (equivalent to eight multipliers) with a time-division multiplex (TDM) factor of 2. One can see that the multipliers are operating at two times the speed required and the final adder 47 or effectively the clock enable signal of the cascade adder chain registers 409 are working at the slower device clock speed. Again, appropriate input delays 72 are required to account for the output register delays.

Figure 8:
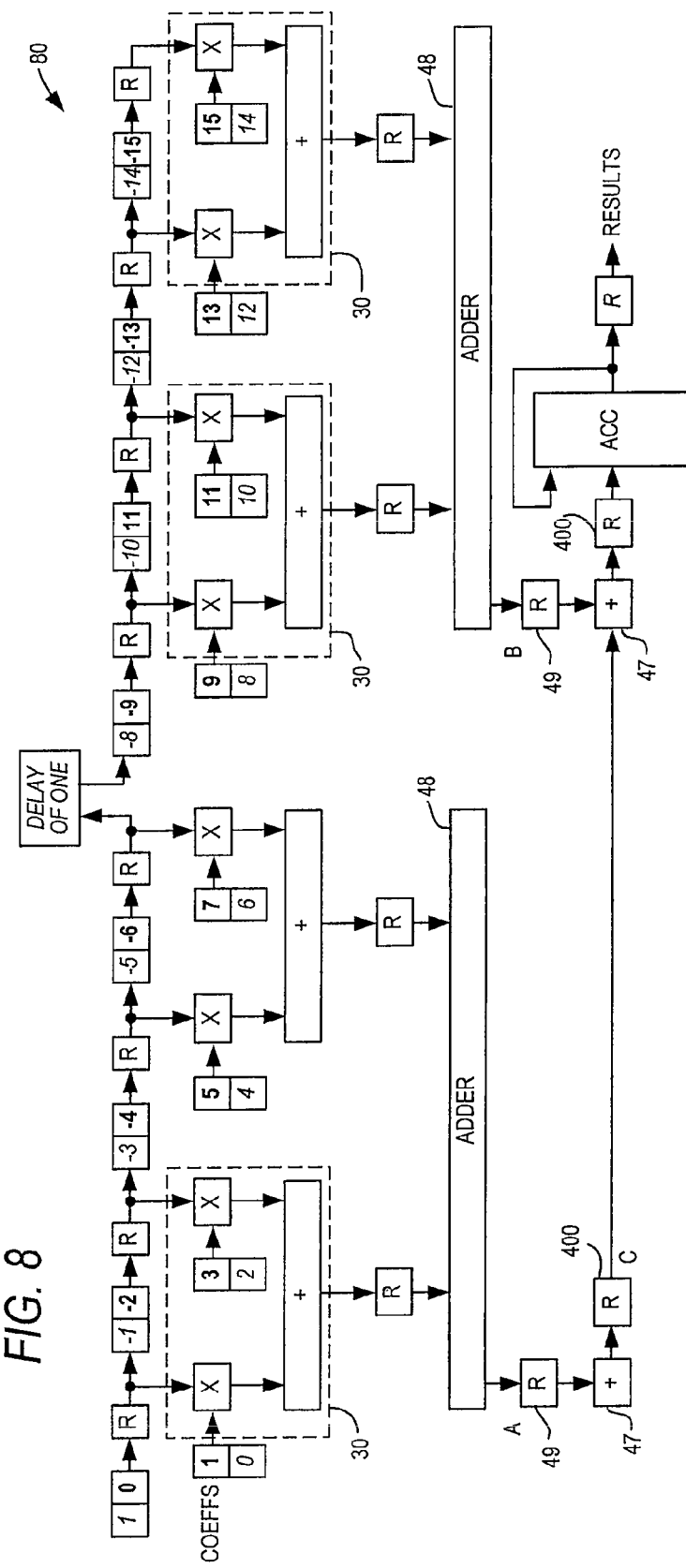
FIG. 8 is a functional diagram of a specialized processing block in accordance with a first preferred embodiment of the present invention in a second configuration as part of a single-channel semi-parallel finite impulse response filter.

A single channel semi-parallel FIR filter 80 also can be implemented without operating the specialized processing block 10 in accumulation mode, as shown in FIG. 8. In single channel semi-parallel FIR filter 80, the accumulator 81 is situated at the end of the output cascade.

Figure 9:
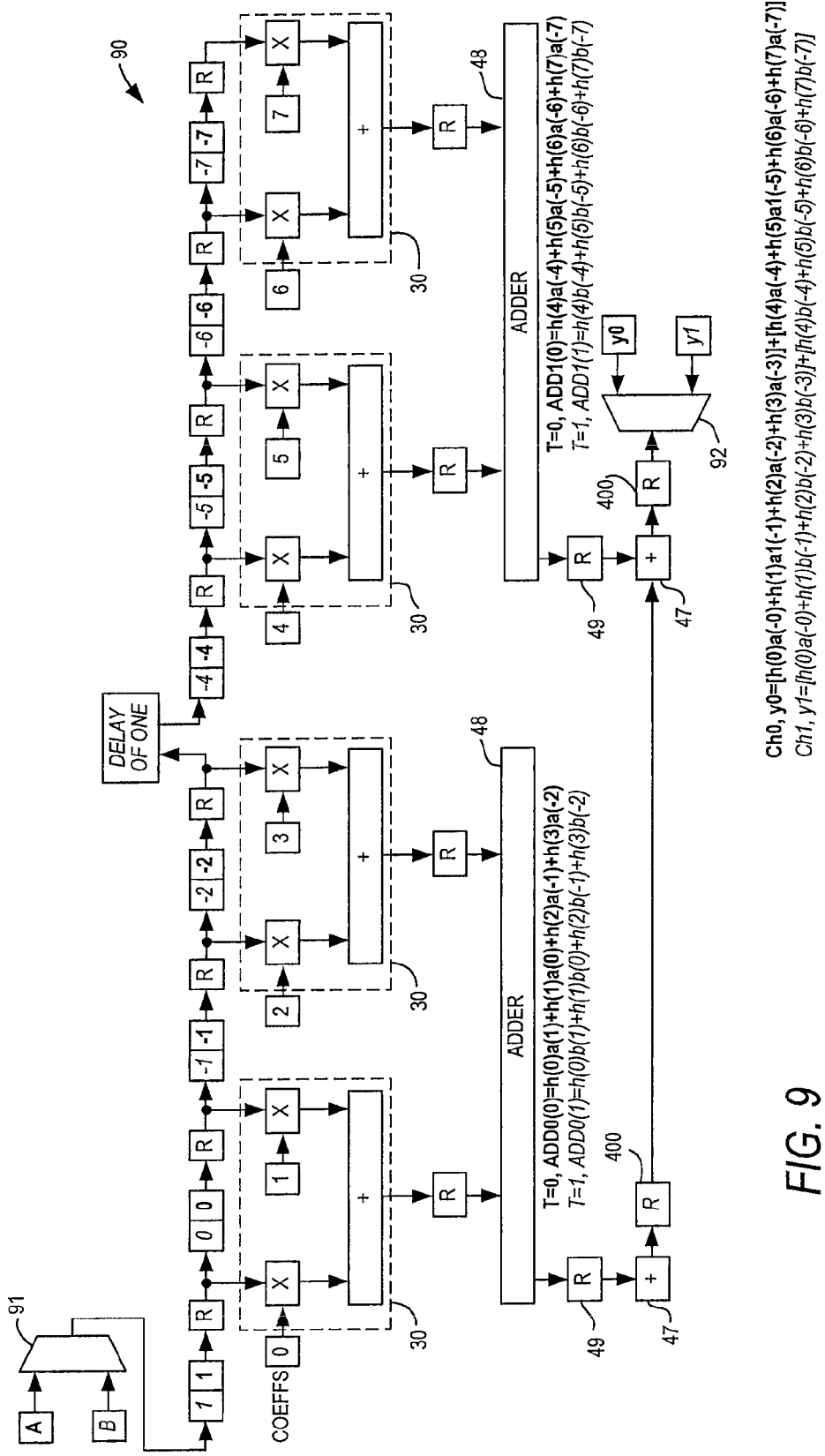
FIG. 9 is a functional diagram of a specialized processing block in accordance with a first preferred embodiment of the present invention configured as part of a multi-channel parallel finite impulse response filter.

FIG. 9 shows a multi-channel parallel FIR filter 90. In a multi-channel parallel FIR filter, the multipliers are time-shared for different data samples while the coefficients remain the same. Again, typically, this may be used when the multiplier speeds exceed the speed at which the FIR filter as a whole is required to operate. Input and output multiplexers/demultiplexers 91, 92 are used to appropriately feed the multi-channel data samples.

It will be recognized that the same result can be achieved using multiple single-channel FIR filters 50. Such a multiple single-channel embodiment may allow each channel to be independent in coefficients, resets, etc. which may provide greater flexibility. However, while the resources required for the multiple single-channel embodiment may be approximately the same as for the multi-channel embodiment, the multiple single-channel embodiment may require a slightly wider fan-out for the coefficient memories. When minimizing that fan-out is important, the multi-channel embodiment may be preferable.

Figure 10:
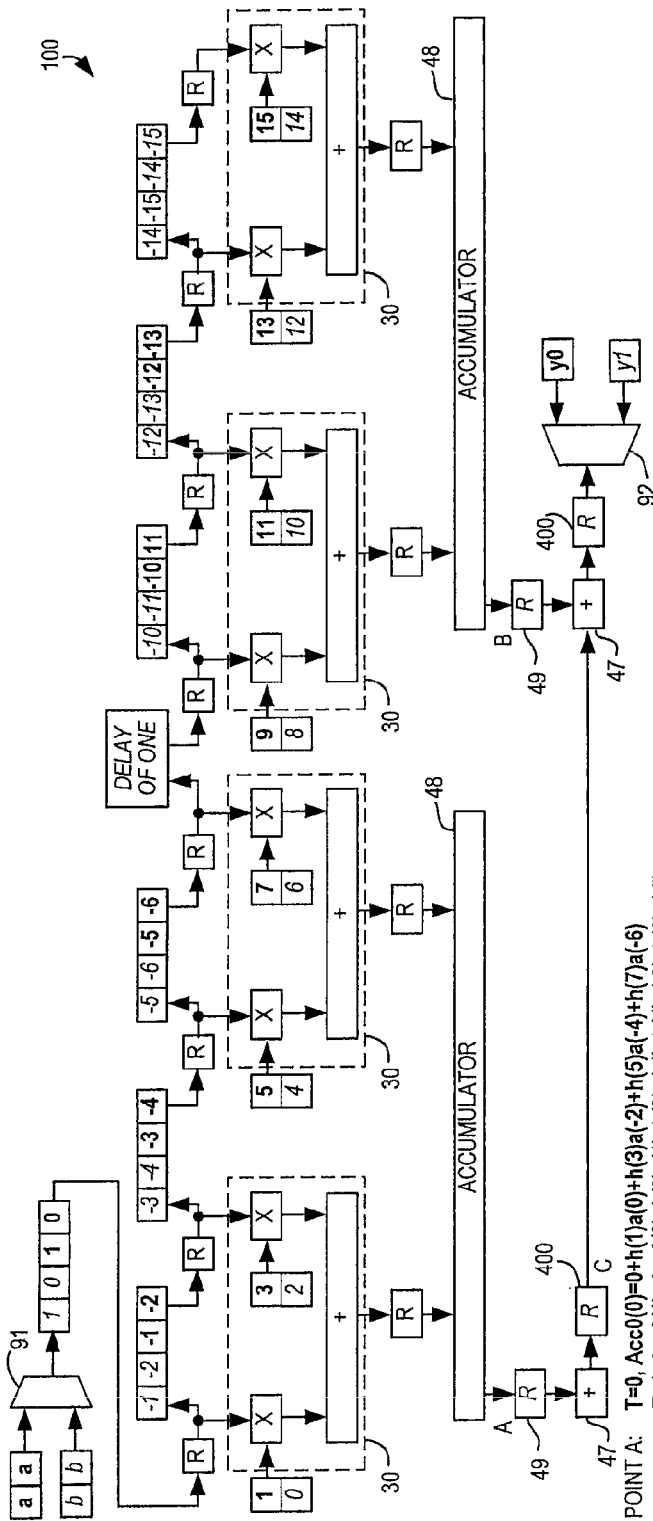
FIG. 10 is a functional diagram of a specialized processing block in accordance with a first preferred embodiment of the present invention configured as part of a multi-channel semi-parallel finite impulse response filter.
Figure 11:
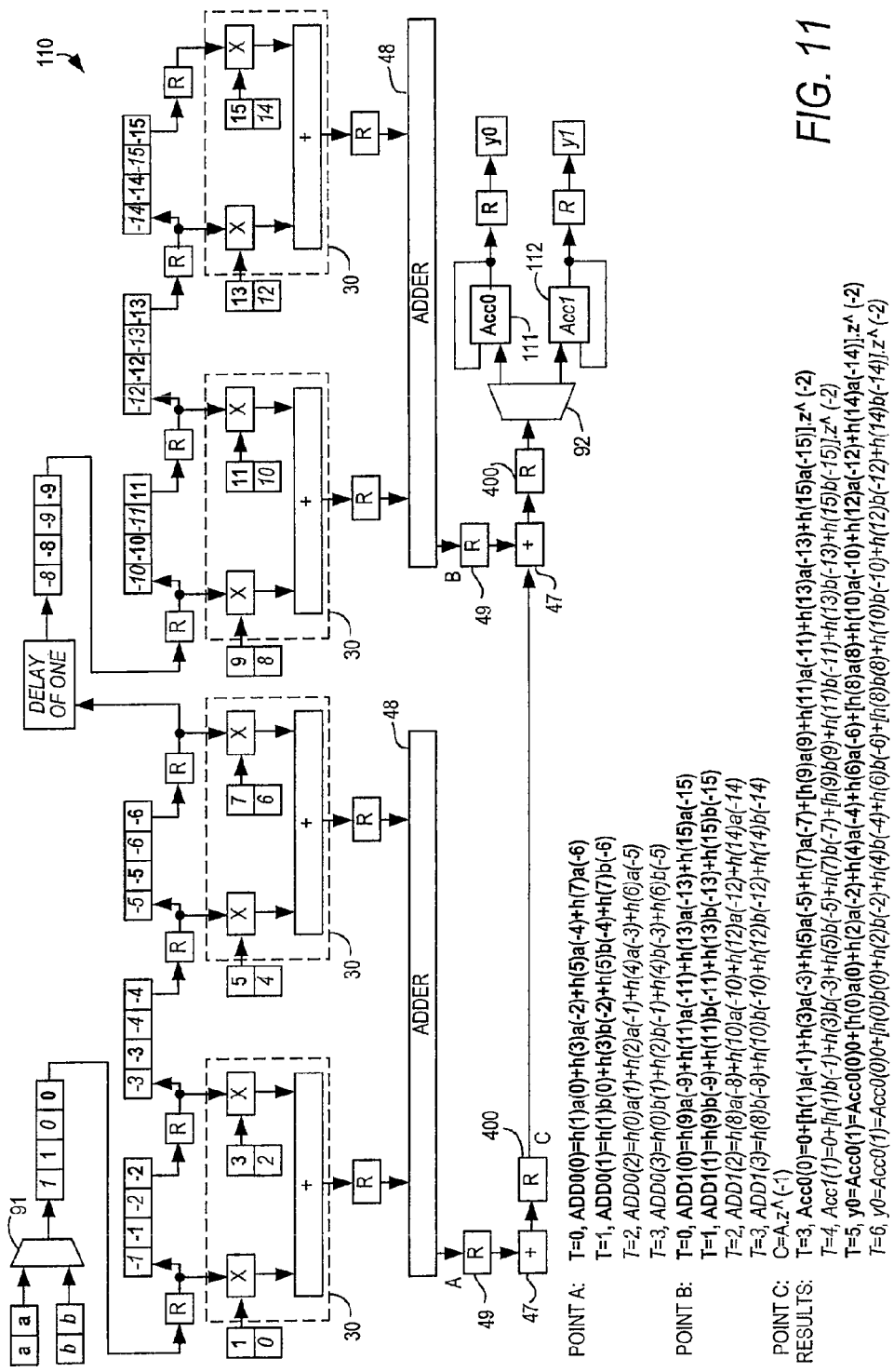
FIG. 11 is a functional diagram of a specialized processing block in accordance with a first preferred embodiment of the present invention in a second configuration as part of a multi-channel parallel finite impulse response filter.

FIG. 10 shows a multi-channel semi-parallel FIR filter 100. This may be the most demanding extreme case of time-sharing. This embodiment is similar to the semi-parallel FIR filter embodiments 70, with the addition of an extra layer of input and output multiplexers/demultiplexers 91, 92 in order to accommodate the multi-channel streams. As in single channel semi-parallel embodiment 80, the accumulation can also be done outside of specialized processing block 10 as shown at 111, 112 in FIG. 11.

Again, it may be less complex to achieve the same result by using multiple versions of a single-channel semi-parallel FIR filter 70, 80, unless minimizing fan-out is important as above. For example, in the case of four FIR filters with 64 taps running at F1 Hz, 4×64=256 taps per F1 cycle would be required. In a multi-channel semi-parallel FIR filter with a TDM factor of 16, one filter with 16 taps running at 16×F1 Hz would require 256 taps per F1 cycle. In a case of four single-channel semi-parallel FIR filters with TDM factors of 16 and having four taps each, there would be a total of 16 taps running at 16×F1 Hz, again requiring 256 taps per F1 cycle. Again, the multiple single channel semi-parallel approach may allow each channel to be independent in coefficients, resets, etc. which may provide greater flexibility. But again also, when minimizing that fan-out is important, a multi-channel semi-parallel embodiment may be preferable.

Figure 12:
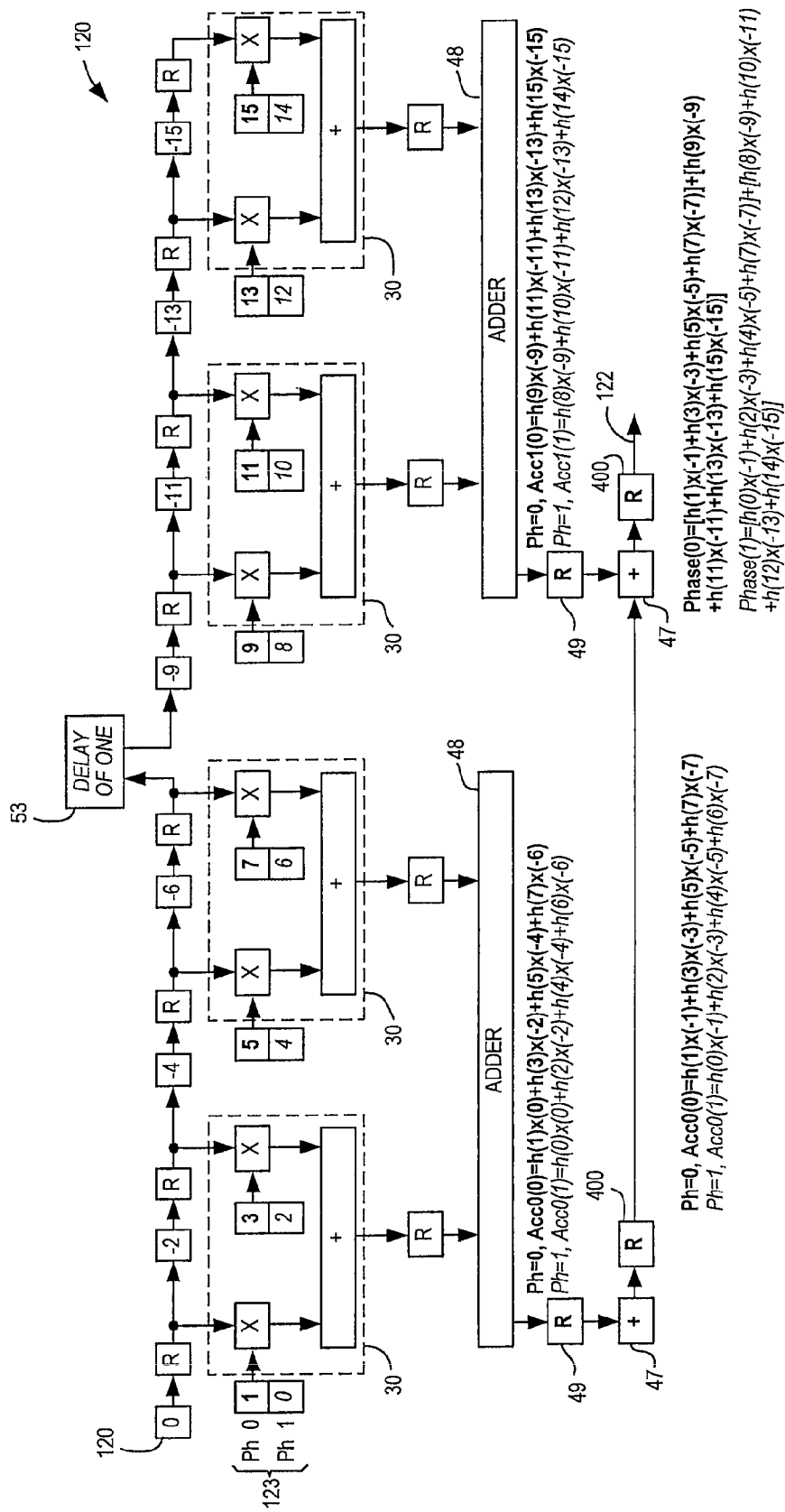
FIG. 12 is a functional diagram of a specialized processing block in accordance with a first preferred embodiment of the present invention configured as part of an interpolation filter.

FIG. 12 shows an interpolation filter 120. Interpolation filters are used when a signal is resampled at a higher rate. No new information is created, but blanks between samples are filled in. In the frequency domain, this results in spectral replication which must be filtered out to avoid distortion. This can be done with low-pass filtering. A single channel semi-parallel FIR filter can function as an interpolation filter.

An interpolation filter can be modeled using polyphase decomposition. If the mathematics is written out, it becomes clear that the same coefficient values cycle regularly through the samples. Therefore, each "phrase" of samples can be held constant while the coefficients 123 are cycled as shown in FIG. 12. In this case the input 121 is fed at F Hz and the output 122 is generated at LF Hz where L is the interpolation factor.

The complement of an interpolation filter is a decimation filter. When a high-frequency filter is sampled at a lower rate, data is lost. The higher frequency components may fold back into the signal, so again low-pass filtering is needed to prevent distortion of the signal. In this case, the filter preferably is like a multi-channel semi-parallel filter as in FIG. 10. The multiple phrases preferably are arranged in the same way as the semi-parallel inputs of FIG. 10, but all of the phrases are accumulated together, rather than being cleared between phrases. Thus the input is at LF Hz and the output is at F Hz.

FIR and IIR filters can be implemented also in lattice form. Specialized processing block 10 preferably can accommodate such filters, as discussed in the examples below is for real reflection coefficients ($\Gamma(k)$).

Figure 13:
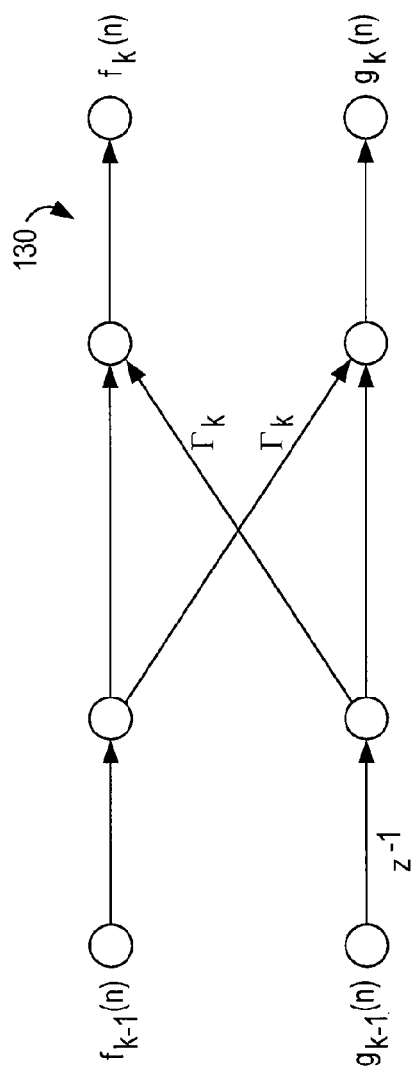
FIG. 13 is a representation of one section of a finite impulse response lattice filter.
Figure 14:
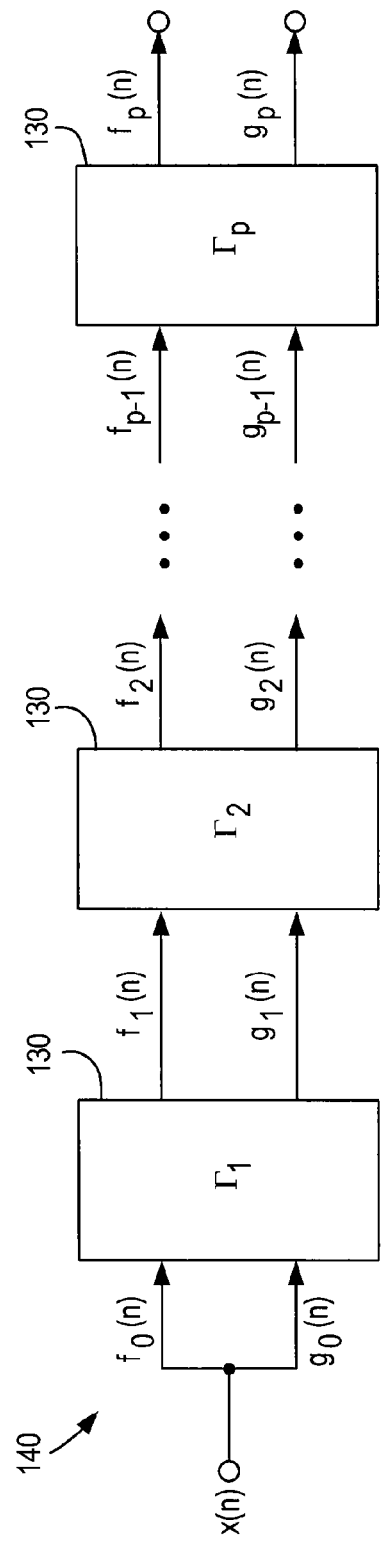
FIG. 14 is a representation of a finite impulse response lattice filter.

Each section 130 of a FIR lattice may be given by:

$$f_k(n)=f_{k-1}(n)+\Gamma_k g_{k-1}(n-1)$$

$$g_k(n)=g_{k-1}(n-1)+\Gamma_k f_{k-1}(n)$$

where $f_0 n = g_0(n)$ and is equal to the input signal x(n). This is shown in FIG. 13. Sections 130 may be concatenated to form a FIR lattice 140, as shown in FIG. 14.

Figure 15:
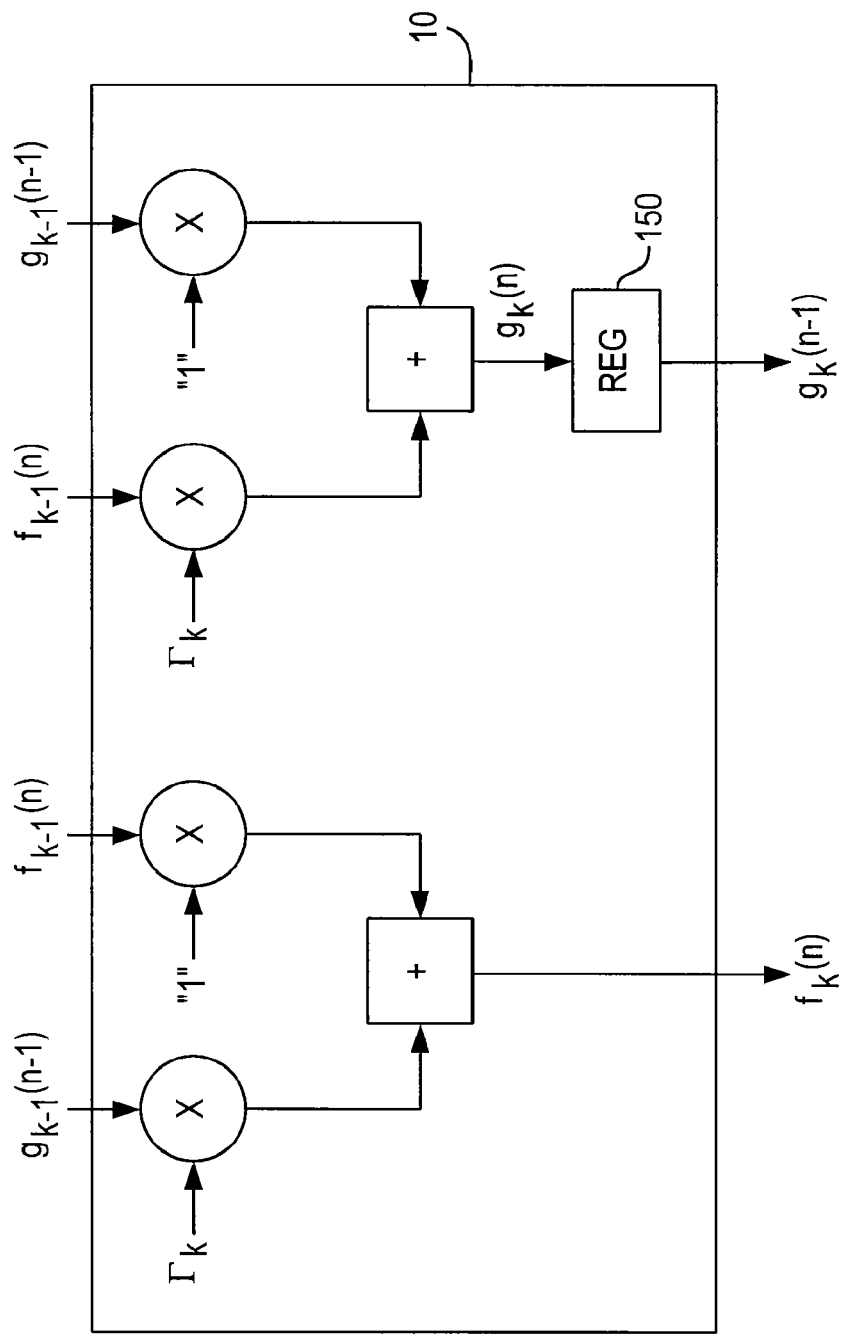
FIG. 15 is a functional diagram of a specialized processing block in accordance with a first preferred embodiment of the present invention configured as part of a finite impulse response lattice filter.

Specialized processing block 10 preferably can be configured to implement each section 130 by the use of one of the bypassable registers 150 in block 10 to act as a delay, as shown in FIG. 15.

Figure 16:
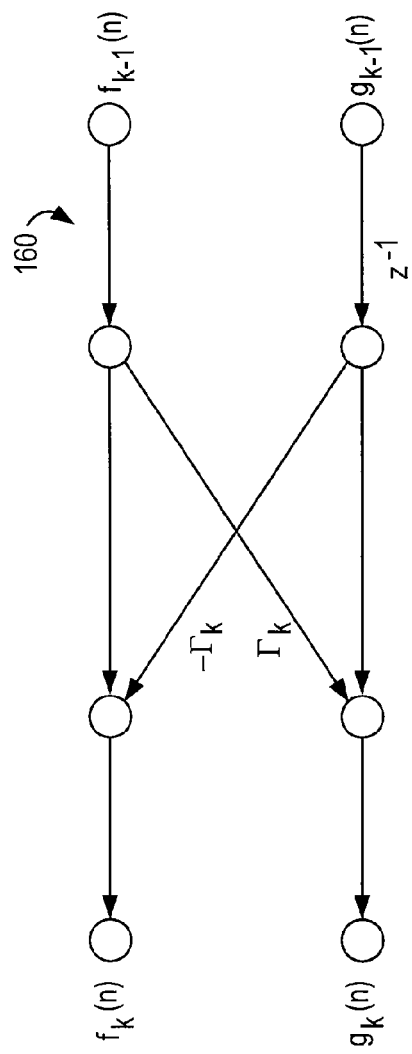
FIG. 16 is a representation of one section of an infinite impulse response lattice filter.
Figure 17:
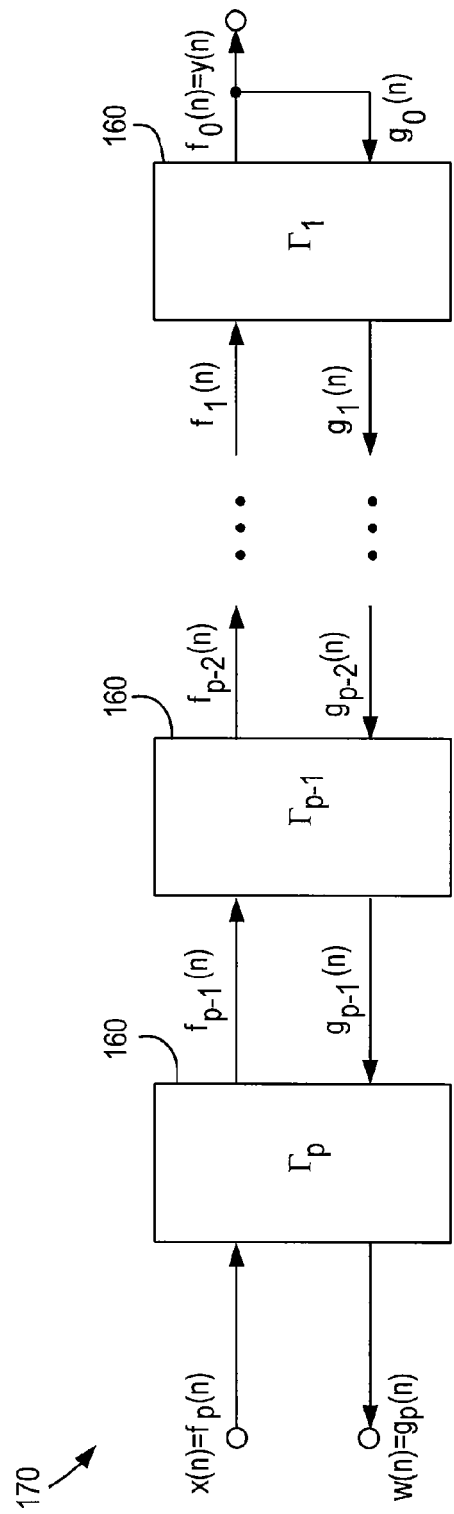
FIG. 17 is a representation of an infinite impulse response lattice filter.

Each section 160 of an IIR lattice may be given by:

$$f_{k-1}(n)=f_k(n)-\Gamma_k g_{k-1}(n-1)$$

$$g_k(n)=g_{k-1}(n-1)+\Gamma_k f_{k-1}(n)$$

as shown in FIG. 16. Sections 160 may be concatenated to form an IIR lattice 170, as shown in FIG. 17.

Figure 18:
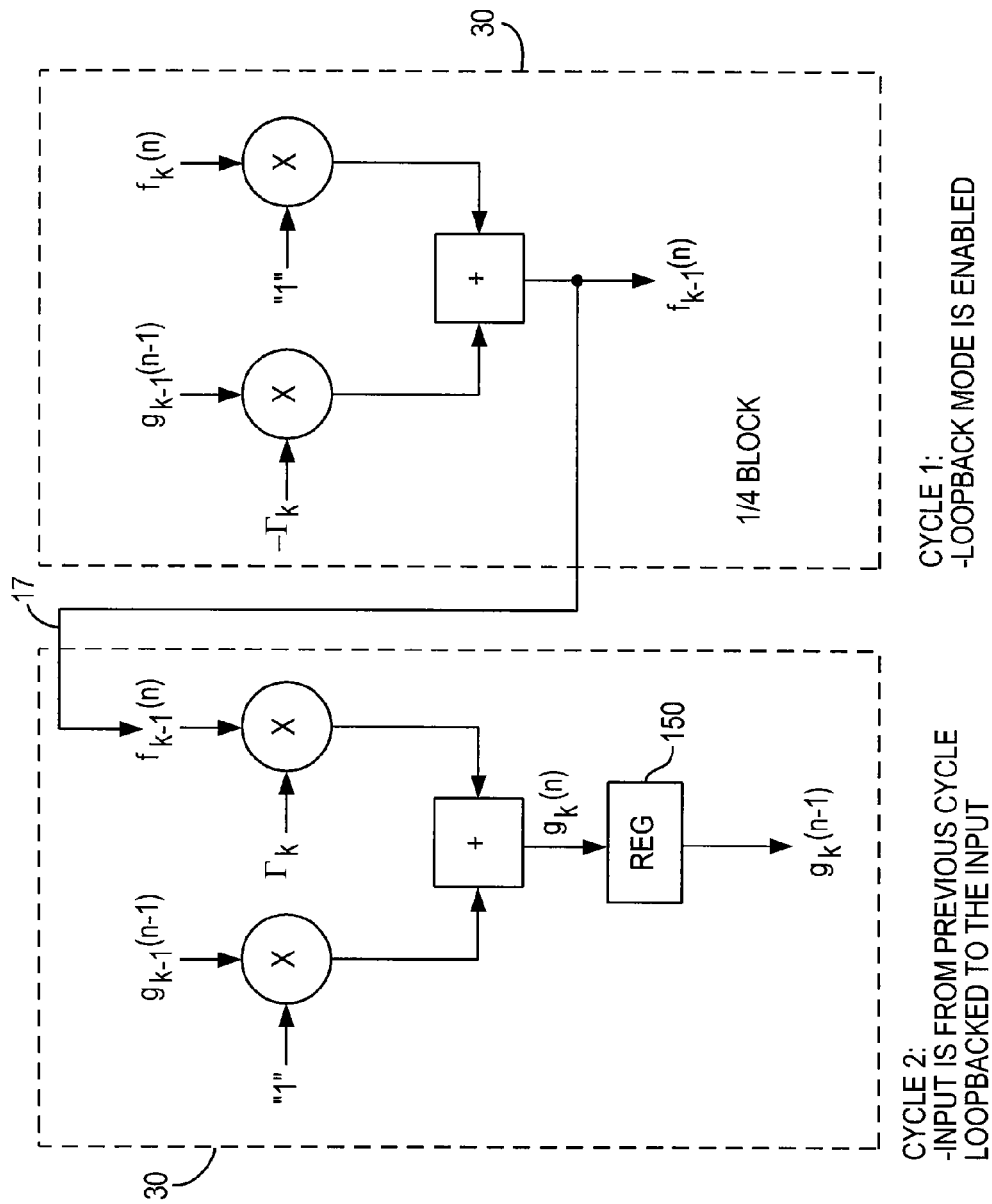
FIG. 18 is a functional diagram of a specialized processing block in accordance with a first preferred embodiment of the present invention configured as part of an infinite impulse response lattice filter.

The IIR form is more complex because the computation of $g_k(n)$ requires $f_{k-1}(n)$ which means there is a delay before it can be computed. Thus in order to implement each section 160 of the IIR lattice 170 two cycles are required. This preferably is implemented by time-sharing the multipliers. The first cycle preferably implements $f_{k-1}(n)$ and second cycle preferably implements $g_k(n)$ using loopback 17, as shown in FIG. 18.

Figure 19:
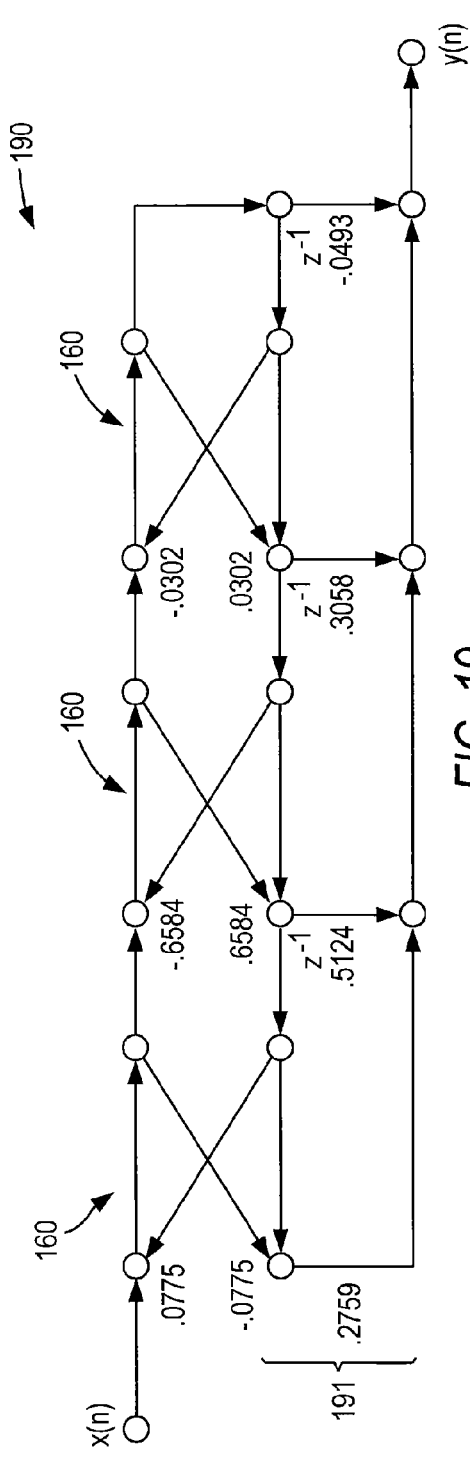
FIG. 19 is a representation of a pole-zero lattice filter.
Figure 20:
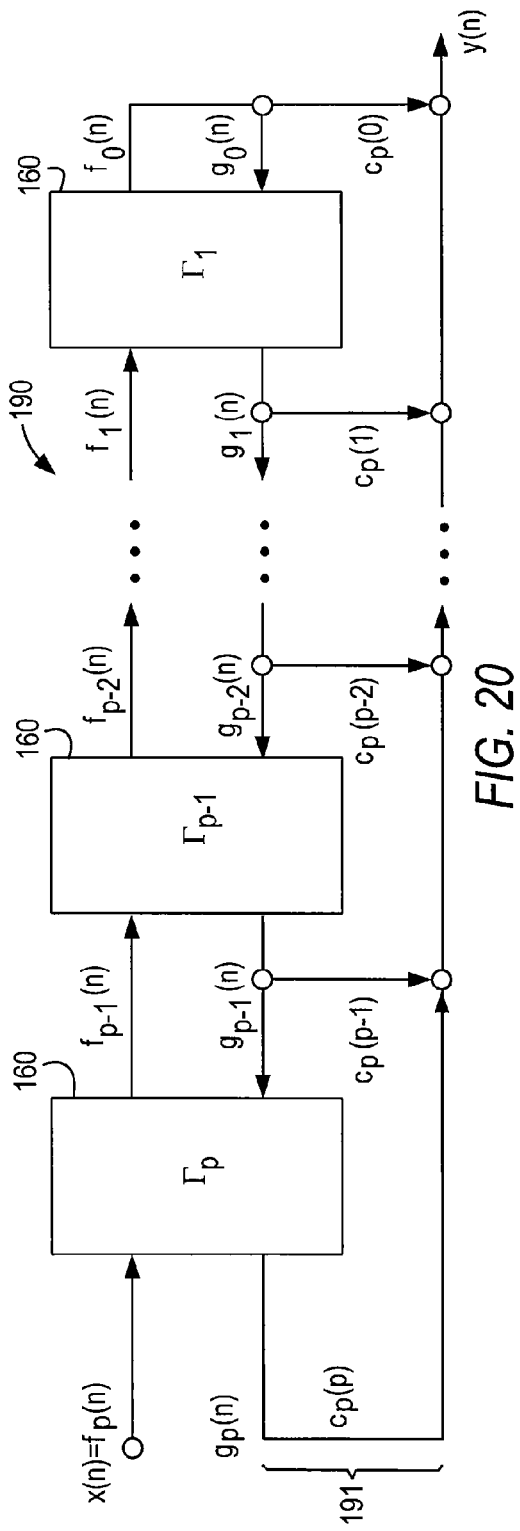
FIG. 20 is a functional diagram of a specialized processing block in accordance with a first preferred embodiment of the present invention configured as part of a pole-zero lattice filter.

A pole-zero lattice filter 190 is a combination of IIR sections 160 and a regular FIR tapped delay line 191 as shown in FIG. 19. Preferably, this may be implemented in specialized processing block 10 by a combination of FIG. 18 and FIG. 5, as shown in FIG. 20.

Specialized processing block 10 also can be used to implement complex filters. Each pair of fundamental processing units 30, whether considered a full block or a half-block, can perform a sum of four 18-by-18 multiplications. Complex filter output chaining can be performed by separating the inputs necessary to generate the Real and Imaginary parts and cascading them in separate columns. For example:

Let $A=a_1+jb_1$, $B=c_1+jd_1$, $R=a_2+jb_2$, $S=c_2+jd_2$. Then:

$$Re\_cascaded=Re(A\times B)+Re(R\times S)=(a_1c_1-b_1d_1)+(a_2c_2-b_2d_2)$$

$$Im\_cascaded=Im(A\times B)+Im(R\times S)=(a_1d_1+b_1c_1)+(a_2d_2+b_2c_2)$$

Figure 21:
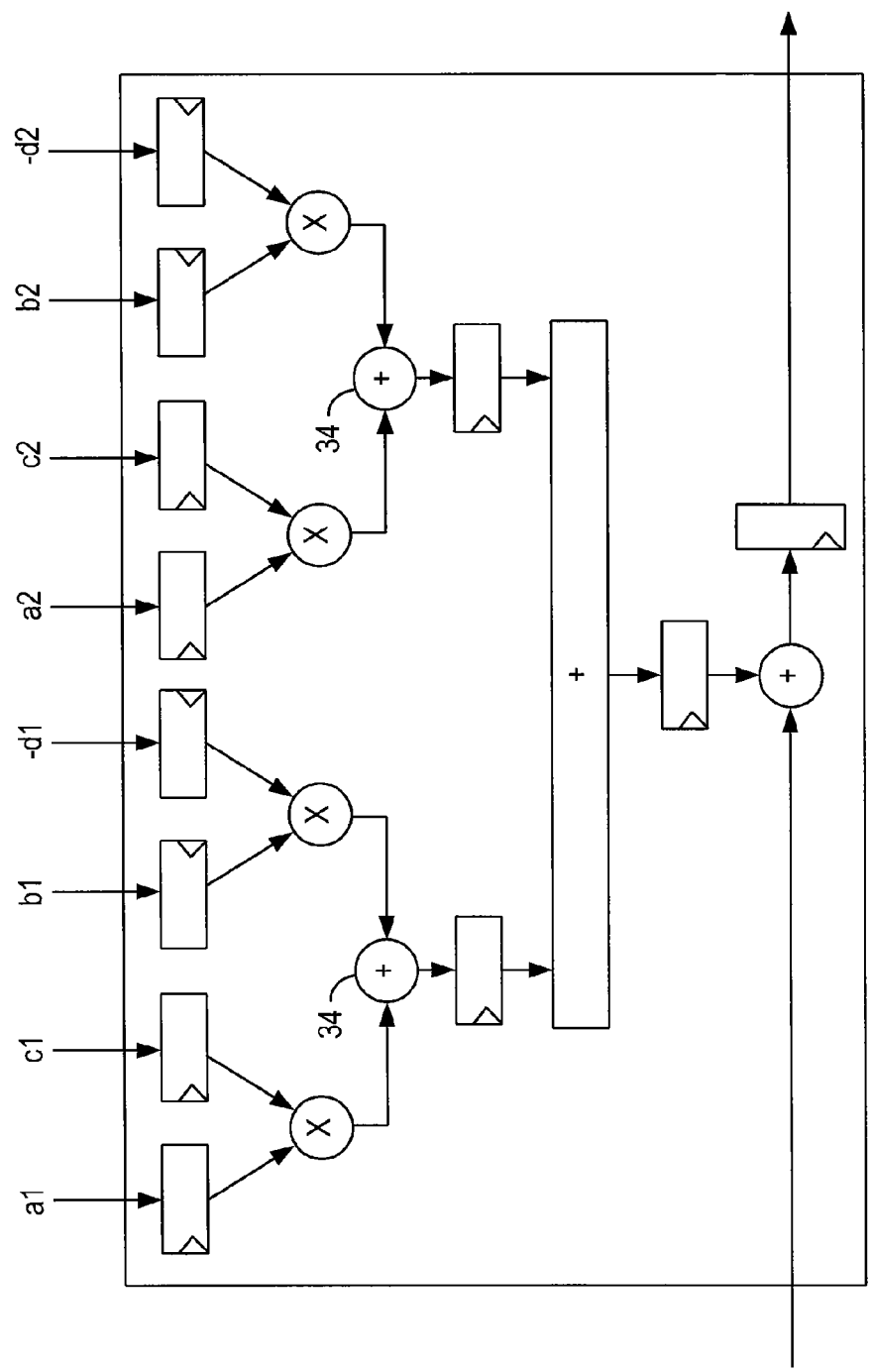
FIG. 21 is a functional diagram of a specialized processing block in accordance with a first preferred embodiment of the present invention configured to compute the real part of a complex filter output.

Each of these expressions is a sum of four multiplications. The computation of the Real part, as an example, is shown in FIG. 21. The $d_1$ and $d_2$ inputs are shown as negated to accommodate the required subtraction. However, as discussed above, adders 34 could be provided with subtraction capability as an alternative to the ability to negate multiplier inputs.

By making minor modifications to specialized processing block 10, some additional filtering functions can be accomplished.

Figure 22:
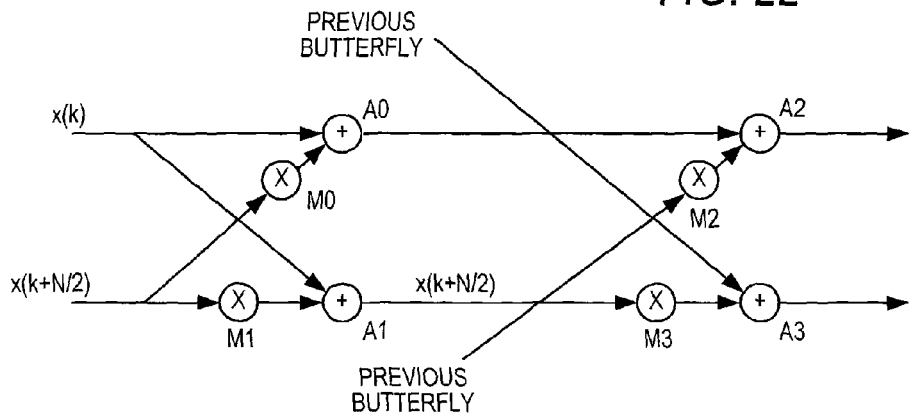
FIG. 22 is a representation of a Fast Fourier Transform butterfly operation.
Figure 23:
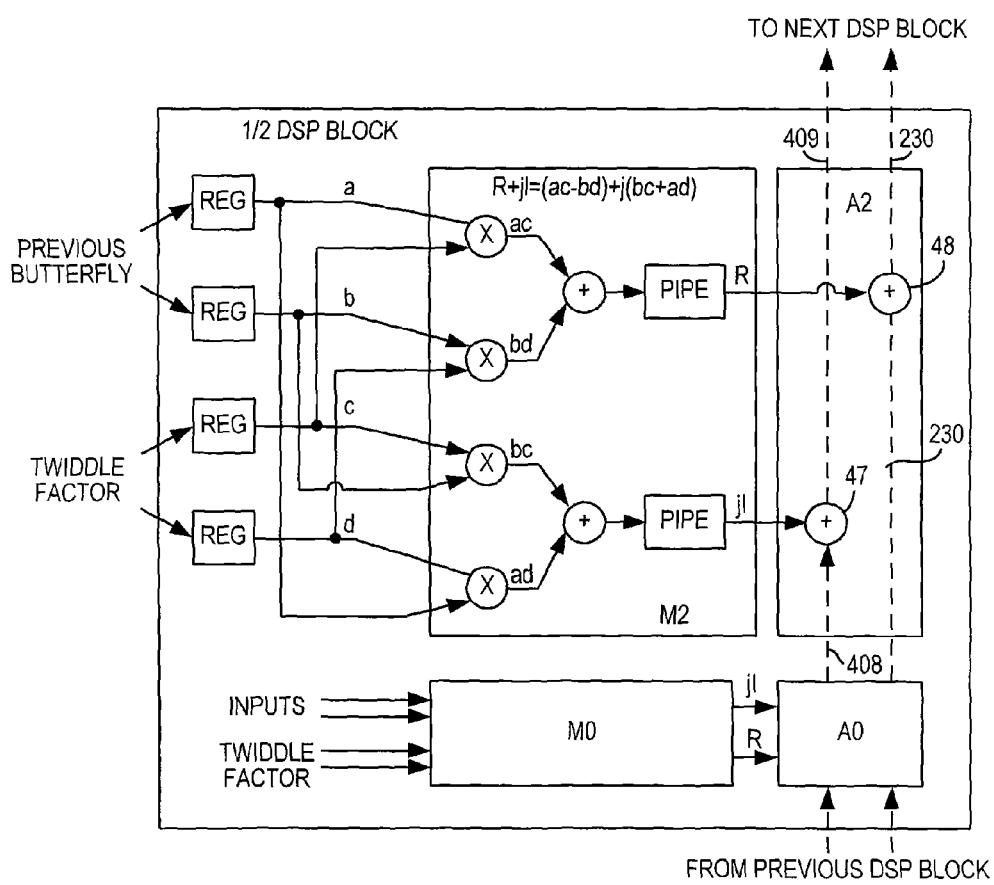
FIG. 23 is a functional diagram of a specialized processing block in accordance with a second preferred embodiment of the present invention configured to compute part of a Fast Fourier Transform butterfly operation.
Figure 24:
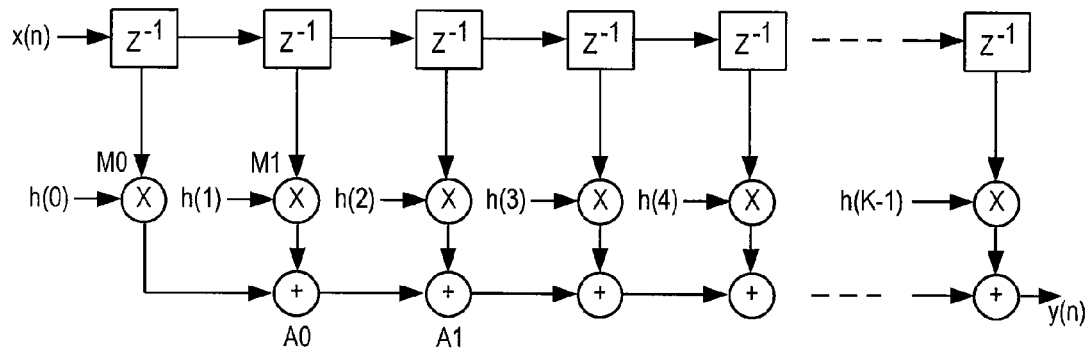
FIG. 24 is a representation of a complex finite impulse response filter.

For example, the "complex butterfly" operation is used in computing a Fast Fourier Transform (FFT). FIG. 22 shows the FFT butterfly operation, while FIG. 23 shows how it may be performed in specialized processing block 10, with modification. In this mode, the specialized processing block is configured as a complex multiplier, as just described. The output of the complex multiplier feeds the output chain as in the FIR mode. However, in this mode, the output chain preferably is split to propagate both the real and imaginary values at the same time. This is accomplished by having appropriate connections 230 so that not only adders 47 but also adders 48 can be chained from block to block.

Figure 25:
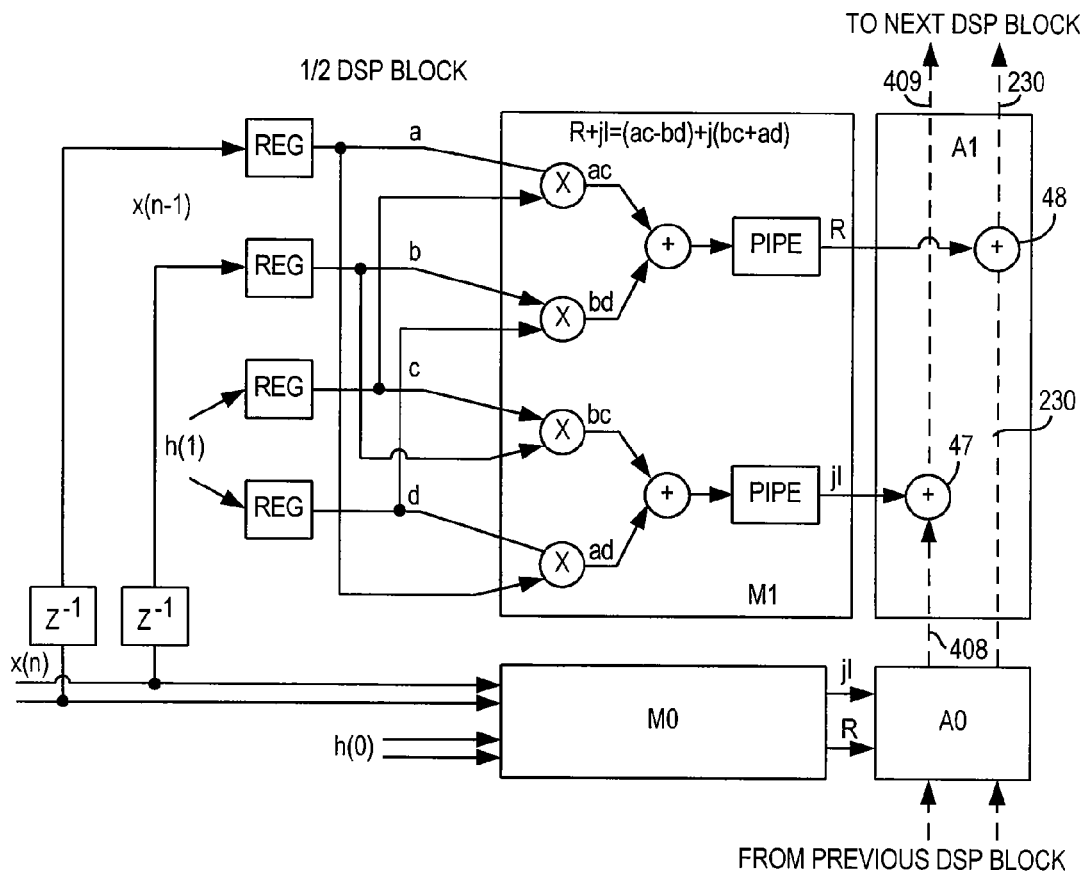
FIG. 25 is a functional diagram of a specialized processing block in accordance with a second preferred embodiment of the present invention configured to compute part of a complex finite impulse response filter.

Like the FFT butterfly, a complex FIR filter (see FIG. 24) also requires that the output chain carry both the real and imaginary numbers. This may be implemented as shown in FIG. 25, having connections 230 as in FIG. 23.

Figure 26:
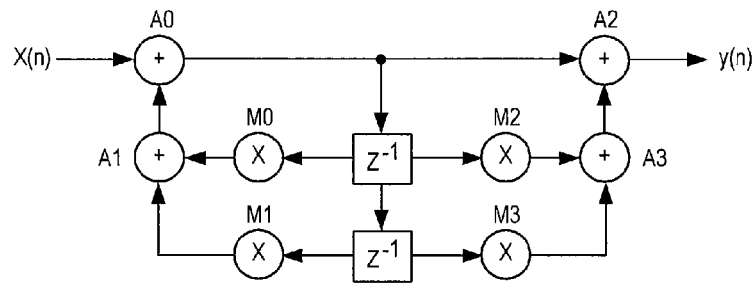
FIG. 26 is a representation of a cascase form infinite impulse response filter.
Figure 27:
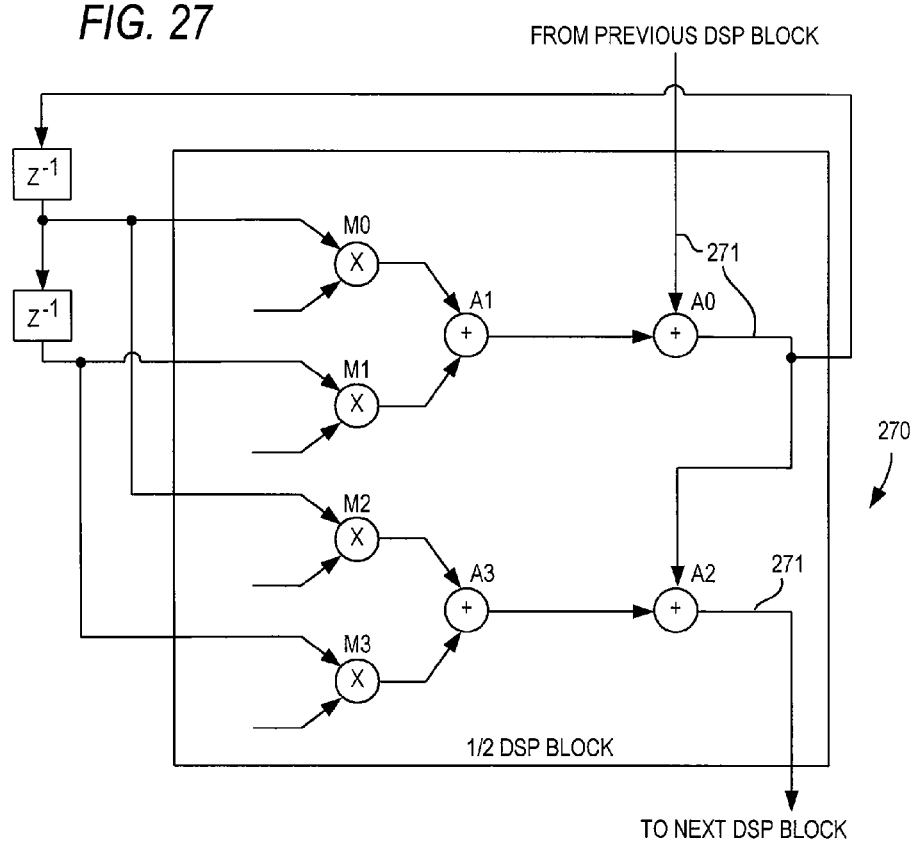
FIG. 27 is a functional diagram of a specialized processing block in accordance with a second preferred embodiment of the present invention configured to compute part of a cascade form infinite impulse response filter.

A Cascade Form IIR filter is shown in FIG. 26. Such a filter can be implemented in a specialized processing block 270 (FIG. 27) according to the invention by modifying specialized processing block 10 to add extra routing 271 as shown in FIG. 27 to allow adder 48 to receive the output of an adder 47 chained from an adjacent specialized processing block 270.

Thus it is seen that a specialized processing block for a programmable logic device, based on a plurality of fundamental processing units, has been provided, and that such a specialized processing block can perform numerous filtering operations useful, e.g., in digital signal processing operations and similar operations.

Figure 28:
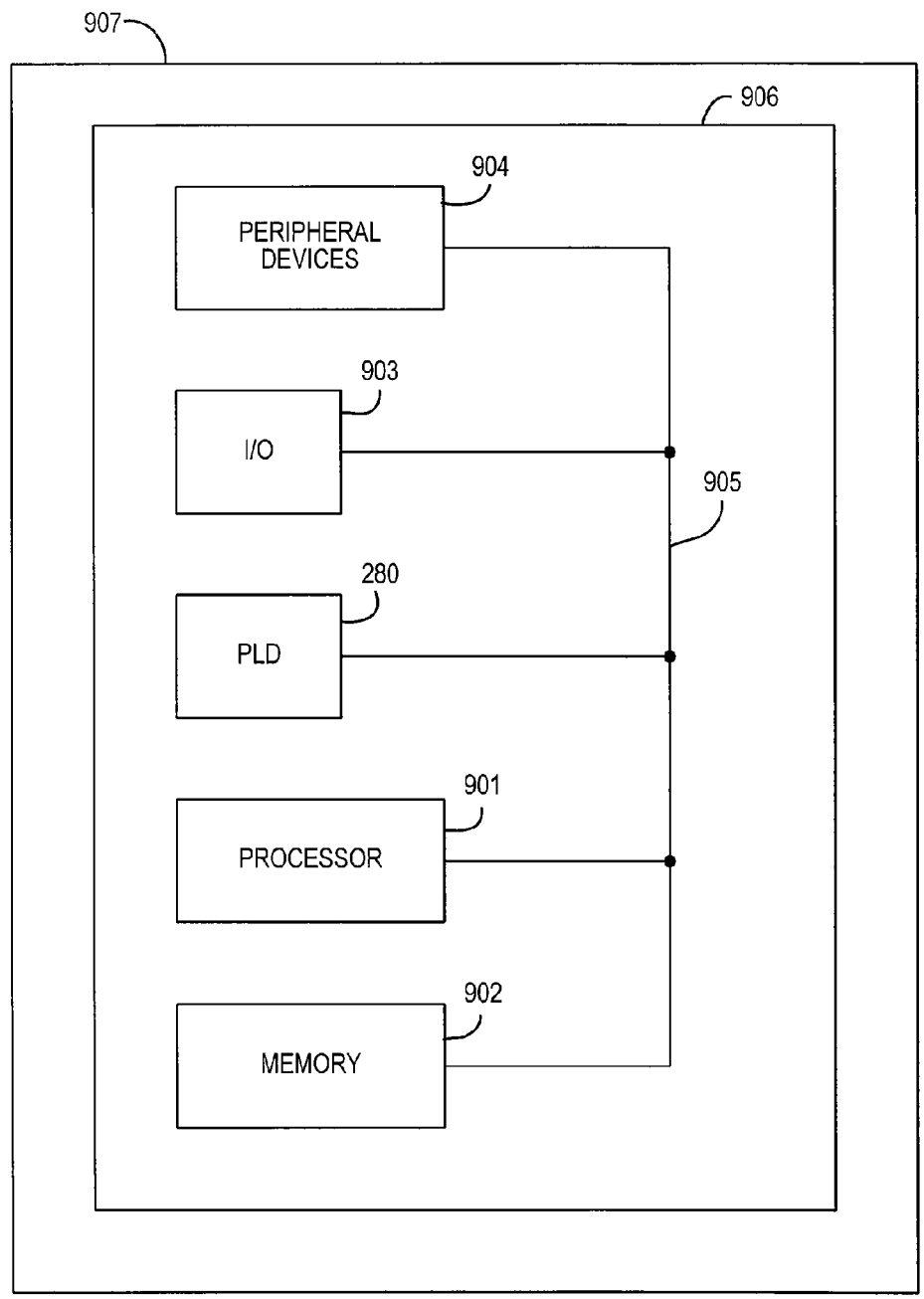
FIG. 28 is a simplified block diagram of an illustrative system employing a programmable logic device incorporating the present invention.

A PLD 280 incorporating such circuitry according to the present invention may be used in many kinds of electronic devices. One possible use is in a data processing system 900 shown in FIG. 28. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 280 can be used to perform a variety of different logic functions. For example, PLD 280 can be configured as a processor or controller that works in cooperation with processor 901. PLD 280 may also be used as an arbiter for arbitrating access to a shared resources in system 900. In yet another example, PLD 280 can be configured as an interface between processor 901 and one of the other components in system 900. It should be noted that system 900 is only exemplary, and that the true scope and spirit of the invention should be indicated by the following claims.

Various technologies can be used to implement PLDs 280 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A specialized processing block for a programmable logic device, said specialized processing block being adaptable to form a finite impulse response (FIR) filter, said specialized processing block comprising:

a plurality of fundamental processing units, each of said fundamental processing units including:

a plurality of partial product generators, each respective one of said partial product generators providing a respective plurality of vectors representing a respective partial product;

compressor circuitry that compresses each respective plurality of vectors into a smaller number of vectors representing said respective partial product; and circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products;

a first plurality of input registers for inputting coefficients of said FIR filter as inputs to said plurality of partial product generators;

a second plurality of input registers for inputting data to said FIR filter, said registers being chained for inputting data seriatim to each said plurality of partial product generators; and an output stage, said output stage including:

a plurality of adders, said plurality of adders being adaptable to provide as an output a sum of (1) a multiplication operation involving two of said fundamental processing units and (2) a corresponding output cascaded from another said plurality of adders in a first other output stage in a first other one of said specialized processing blocks, and an output cascade register for registering said output for cascading to a second other output stage in a second other one of said specialized processing blocks; wherein:

said second plurality of input registers comprises a delay register to compensate for said output cascade register when said second plurality of input registers are chained to a corresponding second plurality of input registers in said second other one of said specialized processing blocks.

2. The specialized processing block of claim 1 further comprising:
loopback circuitry for feeding back output of one of said adders to at least one of said partial product generators.

3. The specialized processing block of claim 2 wherein said loopback circuitry further comprises first and second delay elements; wherein:
said output of said one of said adders is delayed once for feeding back to a respective first partial product generator in each of said fundamental processing units;
said output of said one of said adders is delayed twice for feeding back to a respective second partial product generator in each of said fundamental processing units; and
said specialized processing block is adaptable as a cascade form infinite impulse response filter.

4. A programmable logic device adaptable to form a finite impulse response (FIR) filter, said programmable logic device comprising:
at least one specialized processing block, each said specialized processing block comprising:
a plurality of fundamental processing units, each of said fundamental processing units including:
a plurality of partial product generators, each respective one of said partial product generators providing a respective plurality of vectors representing a respective partial product;
compressor circuitry that compresses each respective plurality of vectors into a smaller number of vectors representing said respective partial product; and
circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; and
an output stage, said output stage including a plurality of adders, said plurality of adders being adaptable to provide as an output a sum of (1) a multiplication operation involving two of said fundamental processing units and (2) a corresponding output cascaded from another said plurality of adders in a first other output stage in a first other one of said specialized processing blocks; each said specialized processing block further comprising:
an output cascade register for registering said output for cascading to a second other output stage in a second other one of said specialized processing blocks; said programmable logic device further comprising:
a first plurality of input registers for inputting data to said FIR filter, said registers being chained for inputting data seriatim to each said plurality of partial product generators; and
a delay register chained with said first plurality of input registers to compensate for said output cascade register when said first plurality of input registers are chained to a corresponding first plurality of input registers in said second other one of said specialized processing blocks.

5. The programmable logic device of claim 4 wherein:
each of said fundamental processing units comprises two partial product generators;
said plurality of fundamental processing units comprises at least two said fundamental processing units arranged in groupings of two said fundamental processing units; and
said plurality of adders in said output stage comprises two adders for each said grouping, said two adders being configurable to perform one of (a) said sum of (1) said multiplication operation involving two of said fundamental processing units and (2) said corresponding output cascaded from said other of said plurality of adders in said first other output stage in said first other one of said specialized processing blocks, and (b) two additions each providing a respective sum of (1) an output of a respective one of said fundamental processing units and (2) a corresponding output cascaded from another said plurality of adders in another output stage in another one of said specialized processing blocks, said output stage having two cascade outputs; wherein:
said programmable logic device is adaptable to implement any one of a Fast Fourier Transform butterfly filter and a complex FIR filter.

6. The programmable logic device of claim 4 wherein said first plurality of input registers and said delay register are incorporated in said specialized processing block.

7. The programmable logic device of claim 4 further comprising a second plurality of input registers for inputting coefficients of said FIR filter as inputs to said plurality of partial product generators.

8. The programmable logic device of claim 4 wherein said first plurality of input registers has a one-to-one correspondence with said plurality of partial product generators, said FIR filter being a regular single-channel FIR filter.

9. The programmable logic device of claim 4 wherein:
said first plurality of input registers has a two-to-one correspondence with said plurality of partial product generators; and
respective pairs of said input registers are paired as inputs to said partial product generators; said programmable logic device further comprising:
logic outside said specialized processing block programmable as soft adders, said soft adders combining said respective pairs of input registers into respective single inputs to said partial product generators; wherein:
said FIR filter is a regular single-channel symmetrical FIR filter.

10. The programmable logic device of claim 9 wherein:
said plurality of partial product generators in said specialized processing block comprises n partial product generators;
said FIR filter comprises m said specialized processing blocks and p=mn of said partial product generators;
said first plurality of input registers comprises a chain of q=2p of said input registers in said logic outside said specialized processing block;
a first half of said chain comprising p said input registers has one said delay register after every n said input registers
a second half of said chain comprising p said input registers lacks any said delay registers;
said logic outside said processing block includes p said soft adders; and
each rth one of said p soft adders adds an rth one of said q input registers to a (q−r+1)th of said q input registers.

11. The programmable logic device of claim 4 wherein:
said programmable logic device has a device clock speed;
said partial product generators and said circuitry for adding operate at a second clock speed faster than said device clock speed;

said output stage operates at said device clock speed; and
during one cycle of said second clock speed, said partial product generators and said circuitry for adding process one set of data to produce results that are accumulated such that during one cycle of said device clock speed said partial product generators and said circuitry for adding process a plurality of sets of data; wherein:
said programmable logic device implements a single-channel semi-parallel FIR filter.

12. The programmable logic device of claim 11 wherein said plurality of sets of data comprises two sets of data.

13. The programmable logic device of claim 11 wherein:
said specialized processing block comprises an accumulator upstream of said output stage; and
said accumulator upstream of said output stage operates at said second clock speed.

14. The programmable logic device of claim 11 wherein:
said specialized processing block comprises an accumulator downstream of said output stage; and
said accumulator downstream of said output stage operates at said device clock speed.

15. The programmable logic device of claim 4 wherein:
said programmable logic device has a device clock speed;
said partial product generators, said circuitry for adding and said output stage operate at a second clock speed faster than said device clock speed;
said programmable logic device further comprises a multiplexer upstream of said first plurality of input registers and a demultiplexer downstream of said output stage; and
during one cycle of said device clock speed said partial product generators, said circuitry for adding and said output stage process a plurality of sets of data; wherein:
said programmable logic device implements a multi-channel parallel FIR filter.

16. The programmable logic device of claim 15 wherein said plurality of sets of data comprises two sets of data.

17. The programmable logic device of claim 4 wherein:
said programmable logic device has a device clock speed;
said partial product generators and said circuitry for adding operate at a second clock speed at least four times said device clock speed;
said output stage operates at a third clock speed at least twice said device clock speed; and
during one cycle of said second clock speed, said partial product generators and said circuitry for adding process one set of data to produce results that are accumulated such that during one cycle of said third clock speed said partial product generators and said circuitry for adding process a plurality of sets of data; said programmable logic device further comprising:
a multiplexer upstream of said first plurality of input registers and a demultiplexer downstream of said output stage; wherein:
during one cycle of said device clock speed said partial product generators, said circuitry for adding and said output stage process a plurality of said plurality of sets of data; wherein:
said programmable logic device implements a multi-channel semi-parallel FIR filter.

18. A programmable logic device adaptable to form an interpolation filter, said programmable logic device comprising:
at least one specialized processing block, each said specialized processing block comprising:
a plurality of fundamental processing units, each of said fundamental processing units including:

a plurality of partial product generators, each respective one of said partial product generators providing a respective plurality of vectors representing a respective partial product;
compressor circuitry that compresses each respective plurality of vectors into a smaller number of vectors representing said respective partial product; and
circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; and
an output stage, said output stage including a plurality of adders, said plurality of adders being adaptable to provide as an output a sum of (1) a multiplication operation involving at least two of said fundamental processing units and (2) a corresponding output cascaded from another said plurality of adders in a first other output stage in a first other one of said specialized processing blocks; each said specialized processing block further comprising:
an output cascade register for registering said output for cascading to a second other output stage in a second other one of said specialized processing blocks; said programmable logic device further comprising:
a first plurality of input registers for inputting data to said interpolation filter, said registers being chained for inputting data seriatim to each said plurality of partial product generators;
a delay register chained with said first plurality of input registers to compensate for said output cascade register when said first plurality of input registers are chained to a corresponding first plurality of input registers in said second other one of said specialized processing blocks; and
a plurality of respective second inputs to said plurality of partial product generators; wherein:
said programmable logic device has a device clock speed;
said partial product generators, said circuitry for adding and said output stage operate at a second clock speed faster than said device clock speed; and
during one cycle of said device clock speed, said partial product generators and said circuitry for adding process one set of data against multiple sets of coefficients on said second inputs to produce multiple sets of results that are output during said one cycle of said device clock speed.

19. A programmable logic device adaptable to form a decimation filter, said programmable logic device comprising:
at least one specialized processing block, each said specialized processing block comprising:
a plurality of fundamental processing units, each of said fundamental processing units including:
a plurality of partial product generators, each respective one of said partial product generators providing a respective plurality of vectors representing a respective partial product;
compressor circuitry that compresses each respective plurality of vectors into a smaller number of vectors representing said respective partial product; and
circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; and an output stage, said output stage including a plurality of adders, said plurality of adders being adaptable to provide as an output a sum of (1) a multiplication operation involving at least two of said fundamental processing units and (2) a corresponding output cascaded from another said plurality of adders in a first other output stage in a first other one of said specialized processing blocks; each said specialized processing block further comprising:

an output cascade register for registering said output for cascading to a second other output stage in a second other one of said specialized processing blocks; said programmable logic device further comprising:

a first plurality of input registers for inputting data to said decimation filter, said registers being chained for inputting data seriatim to each said plurality of partial product generators; and a delay register chained with said first plurality of input registers to compensate for said output cascade register when said first plurality of input registers are chained to a corresponding first plurality of input registers in said second other one of said specialized processing blocks; wherein:

said programmable logic device has a device clock speed;

said partial product generators and said circuitry for adding operate at a second clock speed at least four times said device clock speed;

said output stage operates at a third clock speed at least twice said device clock speed; and during one cycle of said second clock speed, said partial product generators and said circuitry for adding process one set of data to produce results that are accumulated such that during one cycle of said third clock speed said partial product generators and said circuitry for adding process a plurality of sets of data; said programmable logic device further comprising:

a multiplexer upstream of said first plurality of input registers and a demultiplexer downstream of said output stage; wherein:

during one cycle of said device clock speed said partial product generators, said circuitry for adding and said output stage process a plurality of said plurality of sets of data, all of said sets of data being accumulated across cycles of said third clock speed.

20. A programmable logic device adaptable to form a finite impulse response (FIR) lattice filter, said programmable logic device comprising:

a plurality of specialized processing blocks, each said specialized processing block comprising:

a plurality of fundamental processing units, each of said fundamental processing units including:

a plurality of partial product generators, each respective one of said partial product generators providing a respective plurality of vectors representing a respective partial product;

compressor circuitry that compresses each respective plurality of vectors into a smaller number of vectors representing said respective partial product; and circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; wherein:

each of said specialized processing blocks comprises at least one register and computes one stage of said FIR lattice filter, where:

each stage is represented by terms $f_k(n)$ and $g_k(n)$, k represents a stage, n represents a sample, and each of $f_k(n)$ and $g_k(n)$ is expressed in terms of $f_{k-1}(n)$ and $g_{k-1}(n-1)$;

for any kth stage, $f_k(n)$ is computed by one said fundamental processing unit forming a sum of (a) a product of (1) $f_{k-1}(n)$ and (2) 1, and (b) a product of (1) $g_{k-1}(n-1)$ and (2) a coefficient $\Gamma_k$; and for any kth stage, $g_k(n)$ is computed by one said fundamental processing unit forming a sum of (a) a product of (1) $f_{k-1}(n)$ and (2) a coefficient $\Gamma_k$, and (b) a product of (1) $g_{k-1}(n-1)$ and (2) 1, and $g_k(n)$ is delayed by registration in one said at least one register to provide $g_k(n-1)$; wherein:

$f_k(n)$ and $g_k(n-1)$ from the kth stage are available as $f_{k-1}(n)$ and $g_{k-1}(n-1)$ for a (k+1)th stage.

21. A programmable logic device adaptable to form an infinite impulse response (IIR) lattice filter, said programmable logic device comprising:

a plurality of specialized processing blocks, each said specialized processing block comprising:

a plurality of fundamental processing units, each of said fundamental processing units including:

a plurality of partial product generators, each respective one of said partial product generators providing a respective plurality of vectors representing a respective partial product;

compressor circuitry that compresses each respective plurality of vectors into a smaller number of vectors representing said respective partial product; and circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; and loopback circuitry for feeding back an output of said specialized processing block to an input of said specialized processing block; wherein:

each of said specialized processing blocks computes one stage of said IIR lattice filter, where:

each stage is represented by terms $f_k(n)$ and $g_k(n)$, k represents a stage, n represents a sample, and each of $f_k(n)$ and $g_k(n)$ is expressed in terms of $f_{k-1}(n)$ and $g_{k-1}(n-1)$;

for any (k−1)th stage, $f_{k-1}(n)$ is computed by a first said fundamental processing unit forming a sum of (a) a product of (1) $f_k(n)$, which is derived from a kth stage, and (2) 1, and (b) a product of (1) $g_{k-1}(n-1)$ and (2) a coefficient $-\Gamma_k$; and for any kth stage, $g_k(n)$ is computed by a second said fundamental processing unit forming a sum of (a) a product of (1) $f_{k-1}(n)$, which is looped back from said first fundamental processing unit via said loopback circuitry, and (2) a coefficient $\Gamma_k$, and (b) a product of (1) $g_{k-1}(n-1)$ and (2) 1, and $g_k(n)$ is delayed by registration to provide $g_k(n-1)$; wherein:

$f_k(n)$ and $g_k(n-1)$ from the kth stage are available as $f_{k-1}(n)$ and $g_{k-1}(n-1)$ for a (k+1)th stage.

22. The programmable logic device of claim 21 wherein outputs of said k stages are concatenated in a tapped delay line to form a pole-zero lattice filter.

23. A specialized processing block for a programmable logic device, said specialized processing block comprising:
a plurality of fundamental processing units, each of said fundamental processing units including:
a plurality of partial product generators, each respective one of said partial product generators providing a respective plurality of vectors representing a respective partial product;
compressor circuitry that compresses each respective plurality of vectors into a smaller number of vectors representing said respective partial product; and
circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; and
an output stage, said output stage including:
for each pair of fundamental processing units of said specialized processing block, a corresponding pair of adders, said pair of adders being adaptable to provide as an output one of (a) an output of a multiplication operation involving both of said fundamental processing units, and (b) two separate sums, one for each respective one of said fundamental processing units, each respective sum being a sum of (1) a multiplication operation involving said fundamental processing unit and (2) a corresponding output cascaded from another said respective adder in another output stage in another one of said specialized processing blocks.

24. The programmable logic device of claim 23 wherein a plurality of said specialized processing blocks are adaptable to be configured as an FFT butterfly filter.

25. The programmable logic device of claim 23 wherein a plurality of said specialized processing blocks are adaptable to be configured as a complex FIR filter, wherein each respective adder in said pair of adders is part of a respective chain, one said respective chain being a real part of output of said filter and one said respective chain being an imaginary part of output of said filter.

26. A specialized processing block for a programmable logic device, said specialized processing block comprising:
a plurality of fundamental processing units, each of said fundamental processing units including:
a plurality of partial product generators, each respective one of said partial product generators providing a respective plurality of vectors representing a respective partial product;
compressor circuitry that compresses each respective plurality of vectors into a smaller number of vectors representing said respective partial product; and
circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; and
an output stage, said output stage including:
for each pair of fundamental processing units of said specialized processing block, a corresponding pair of adders, said pair of adders being adaptable to provide as an output one of (a) an output of a multiplication operation involving both of said fundamental processing units, and (b) a cascade of said output of said multiplication operation with a corresponding output of a multiplication operation from a corresponding output stage associated with two other said fundamental processing units.

27. The programmable logic device of claim 26 wherein a plurality of said specialized processing blocks are adaptable to be configured as a Cascade Form IIR filter.

* * * * *